US009401231B2

(12) United States Patent
Elam et al.

(10) Patent No.: US 9,401,231 B2
(45) Date of Patent: Jul. 26, 2016

(54) METHOD FOR PRODUCING HIGHLY CONFORMAL TRANSPARENT CONDUCTING OXIDES

(75) Inventors: Jeffrey W. Elam, Elmhurst, IL (US); Anil U. Mane, Downers Grove, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 732 days.

(21) Appl. No.: 13/249,864

(22) Filed: Sep. 30, 2011

(65) Prior Publication Data

US 2013/0082219 A1 Apr. 4, 2013

(51) Int. Cl.
*H01B 1/06* (2006.01)
*C23C 16/455* (2006.01)
*C23C 16/40* (2006.01)

(52) U.S. Cl.
CPC ............. *H01B 1/06* (2013.01); *C23C 16/407* (2013.01); *C23C 16/45525* (2013.01); *C23C 16/45553* (2013.01)

(58) Field of Classification Search
None
See application file for complete search history.

(56) References Cited

U.S. PATENT DOCUMENTS

| 7,709,056 | B2 | 5/2010 | Elam et al. | |
|---|---|---|---|---|
| 2008/0210973 | A1* | 9/2008 | Chen et al. | 257/102 |
| 2008/0286448 | A1* | 11/2008 | Elam et al. | 427/109 |
| 2010/0006145 | A1* | 1/2010 | Lee | 136/255 |
| 2011/0206846 | A1* | 8/2011 | Elam et al. | 427/255.32 |
| 2012/0058576 | A1* | 3/2012 | Beck et al. | 438/5 |
| 2013/0082219 | A1 | 4/2013 | Elam et al. | |

OTHER PUBLICATIONS

Asikainen, et al., "AFM and STM studies on In$_2$O$_3$ and ITO thin films deposited by atomic layer epitaxy," Applied surface science, vol. 99, 1996, pp. 91-98.
Asikainen, et al., "ALE deposition of indium tin oxide thin films," Vacuum, vol. 46, No. 8-10, 1995, p. 887.
Asikainen, et al., "Atomic layer deposition growth of zirconium doped In$_2$O$_3$ films," Thin Solid Films, vol. 440, 2003, pp. 152-154.
Asikainen, et al., "Fluorine Implantation of Atomic Layer Epitaxy grown In$_2$O$_3$ Films," Journal of the Electrochemical Society, vol. 144, No. 6, Jun. 1997, pp. L140-L141.
Asikainen, et al., "Growth of In$_2$O$_3$ Thin Films by Atomic Layer Epitaxy," Journal of the Electrochemical Society, vol. 141, No. 11, Nov. 1994, pp. 3210-3213.
Asikainen, et al., "Growth of Indium-Tin-Oxide Thin Films by Atomic Layer Epitaxy," Journal of the Electrochemical Society, vo. 142, No. 10, Oct. 1995, pp. 3538-3541.
Asikainen, et al., "Modifying Ale grown in In$_2$O$_3$ films by benzoyl fluoride pulses," Applied Surface Science, vol. 112, 1997, pp. 231-235.

(Continued)

*Primary Examiner* — Charles Garber
*Assistant Examiner* — Brigitte Paterson
(74) *Attorney, Agent, or Firm* — Foley & Lardner LLP

(57) ABSTRACT

A method for forming a transparent conducting oxide product layer. The method includes use of precursors, such as tetrakis-(dimethylamino) tin and trimethyl indium, and selected use of dopants, such as SnO and ZnO for obtaining desired optical, electrical and structural properties for a highly conformal layer coating on a substrate. Ozone was also input as a reactive gas which enabled rapid production of the desired product layer.

6 Claims, 41 Drawing Sheets

(56) References Cited

OTHER PUBLICATIONS

Elam, et al., "Atomic Layer deposition of $In_2O_3$ Using Cyclopentadienyl Indium: A New Synthetic Route to Transparent Conducting Oxide Films," Chemistry of Materials, vol. 18, 2006, pp. 3571-3578.

Elam, et al., "Atomic Layer Deposition of Indium Tin Oxide Thin Films Using Nonhalogenated Precursors," Journal of Physical Chemistry C, vol. 112, 2008, pp. 1938-1945.

Kim, et al., "MOCVD route to $In_2O_3$ thin films on $SiO_2$ substrates," Journal of Materials Science, 2005, 3 pages.

Lee, et al., "Self-Limiting Film Growth of Transparent Conducting In2O3 by Atomic Layer Deposition using Trimethylindium and Water Vapor," The Journal of Physical Chemistry C, vol. 115, No. 31, 2011, pp. 15384-15389.

Libera, et al., "Indium Oxide Atomic Layer Deposition Facilitated by the Synergy between Oxygen and Water," Chemistry of Materials, vol. 23, 2011, pp. 2150-2158.

Nilsen, et al., "Thin films of $In_2O_3$ by aomic lyer deposition using in(acac)$_3$," Thin Solid Films, vol. 517, 2009, pp. 6320-6322.

Ott, et al., "Surface chemistry of $In_2O_3$ deposition using $In(CH_3)_3$ and $H_2O$ in a binary reaction sequence," Applied Surface Science, vol. 112, 1997, pp. 205-215.

Ritala, et al., "Enhanced Growth Rate in Atomic Layer Epitaxy of Indium Oxide and Indium-Tin Oxide Thin Films," Electrochemical and solid-State Letters, vol. 1, No. 3, 1998, pp. 156-157.

Saitoh, et al., "Electrical Properties of Indium Oxide Films in the Presence of Hydrogen and Ethanol Gasses," The Japan Journal of Applied Physics, vol. 42, pt. 1, No. 5A, May 2003, pp. 2976-2800.

Suzuki, et al., "Transparent Conductive Thing Films of Sn Doped $In_2O_3$ Grown by Aerosol-Assisted CVD Using $In^{III}$ Acetylacetonate with 5 mol%$^{IV}$ Bis-acetylacetonate Dibromide Dissolved in Acetylacetone," Chemical Vapor Deposition, vol. 12, 2006, pp. 608-613.

\* cited by examiner

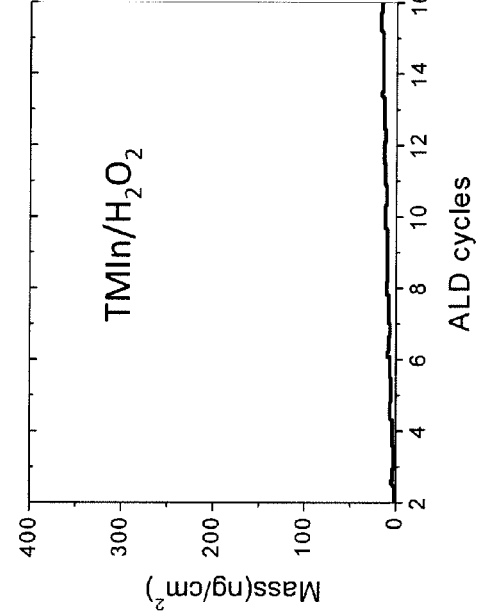
FIG. 4A TMIn/H₂O
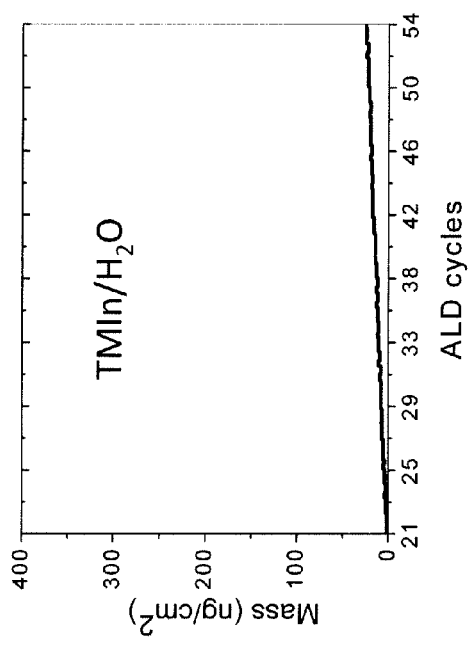
FIG. 4B TMIn/H₂O₂
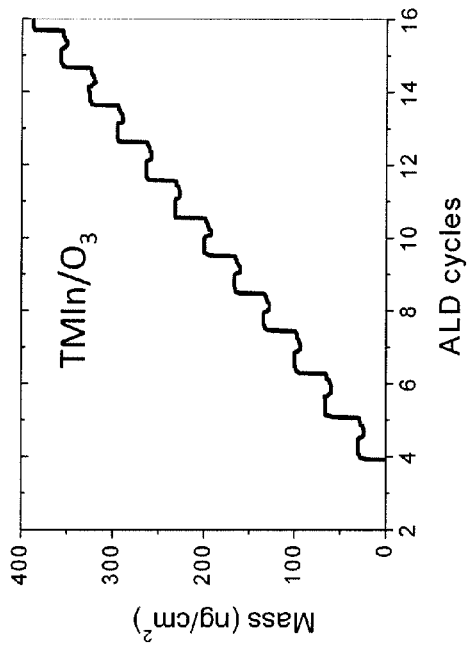
FIG. 4C TMIn/O₂
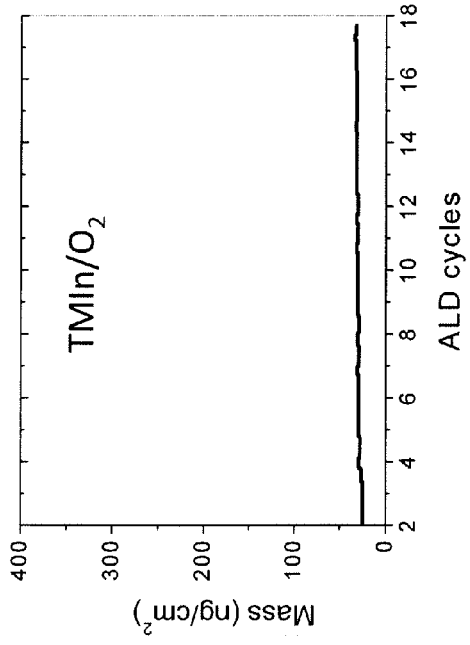
FIG. 4D TMIn/O₃

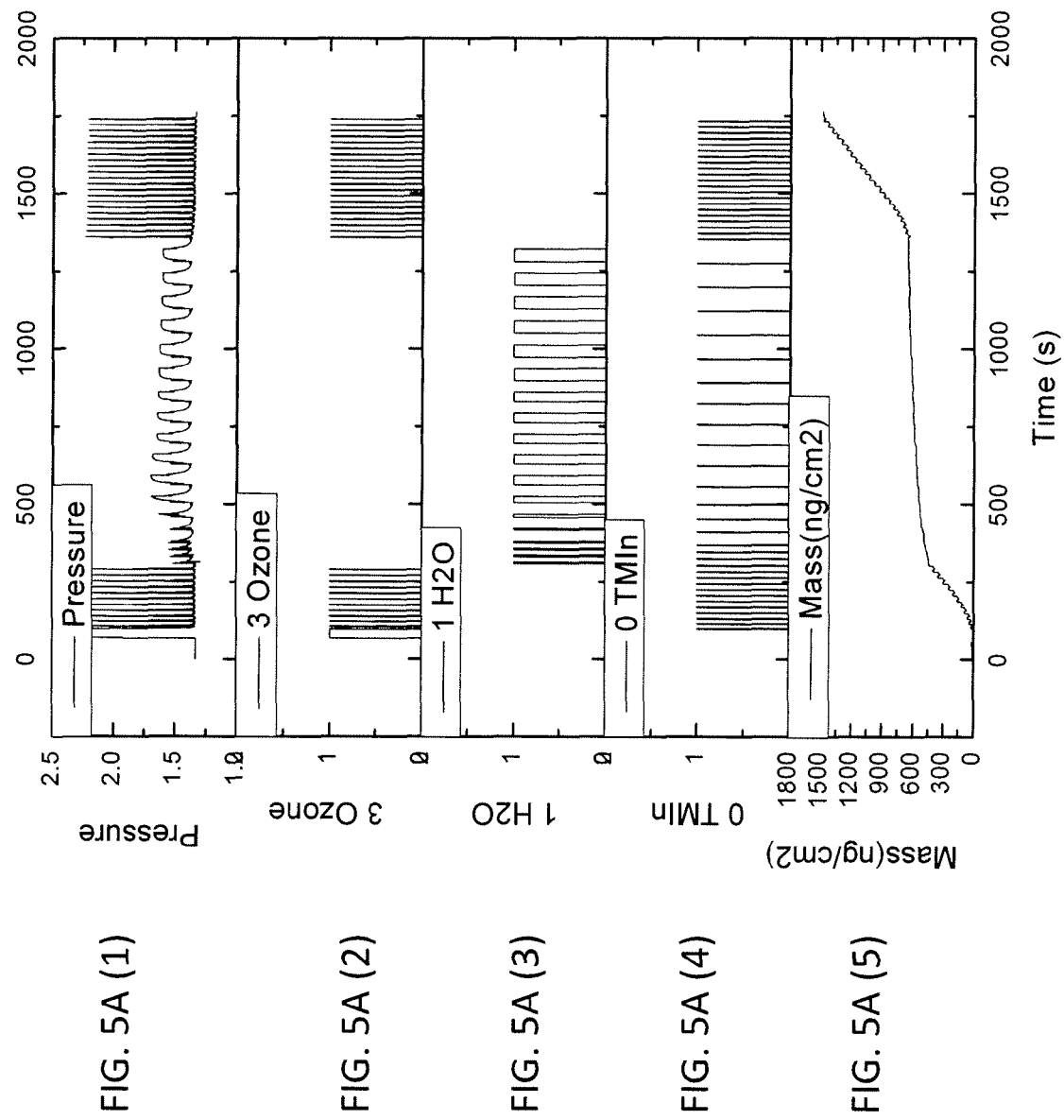

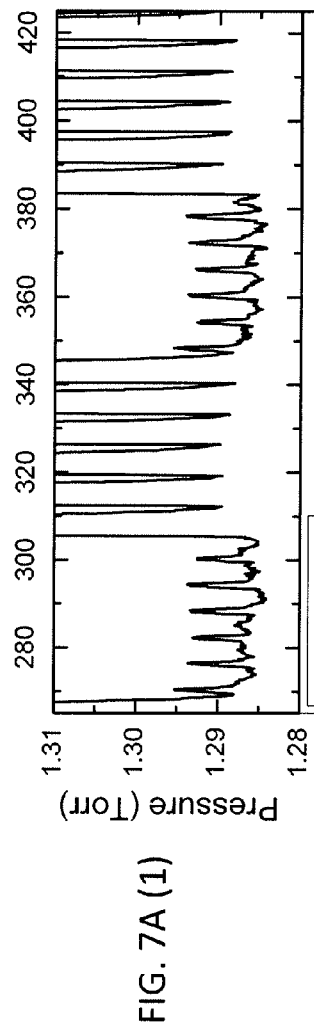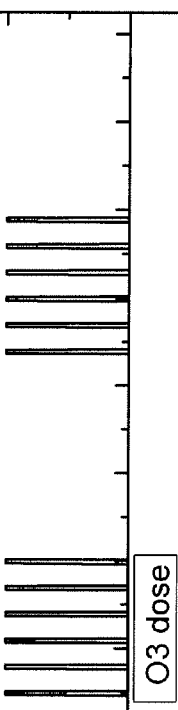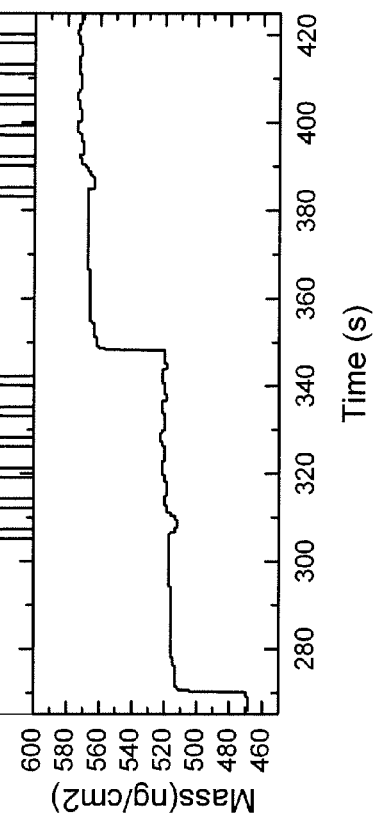
FIG. 7A (1)
FIG. 7A (2)
FIG. 7A (3)
FIG. 7A (4)

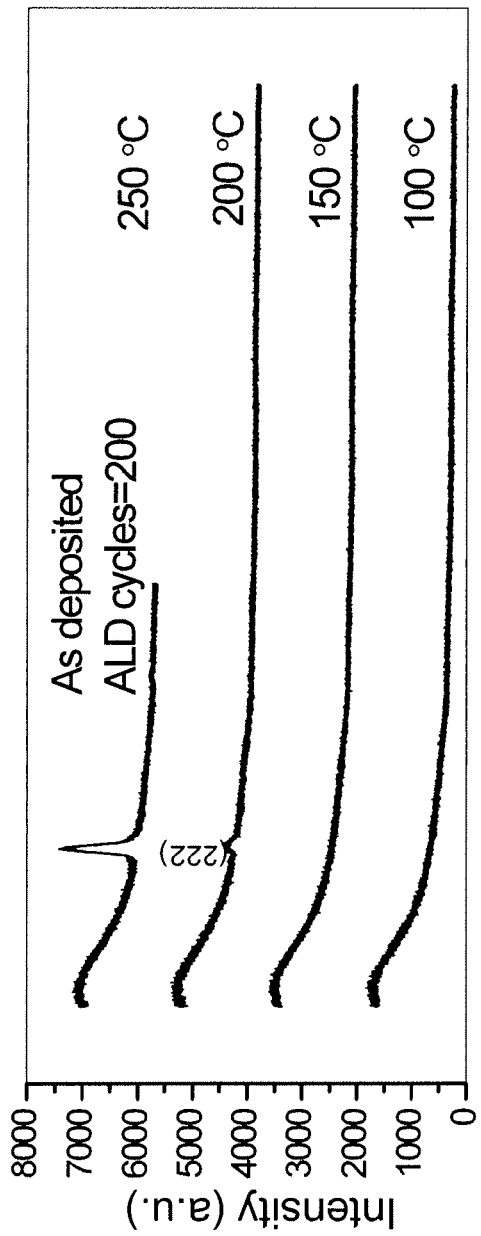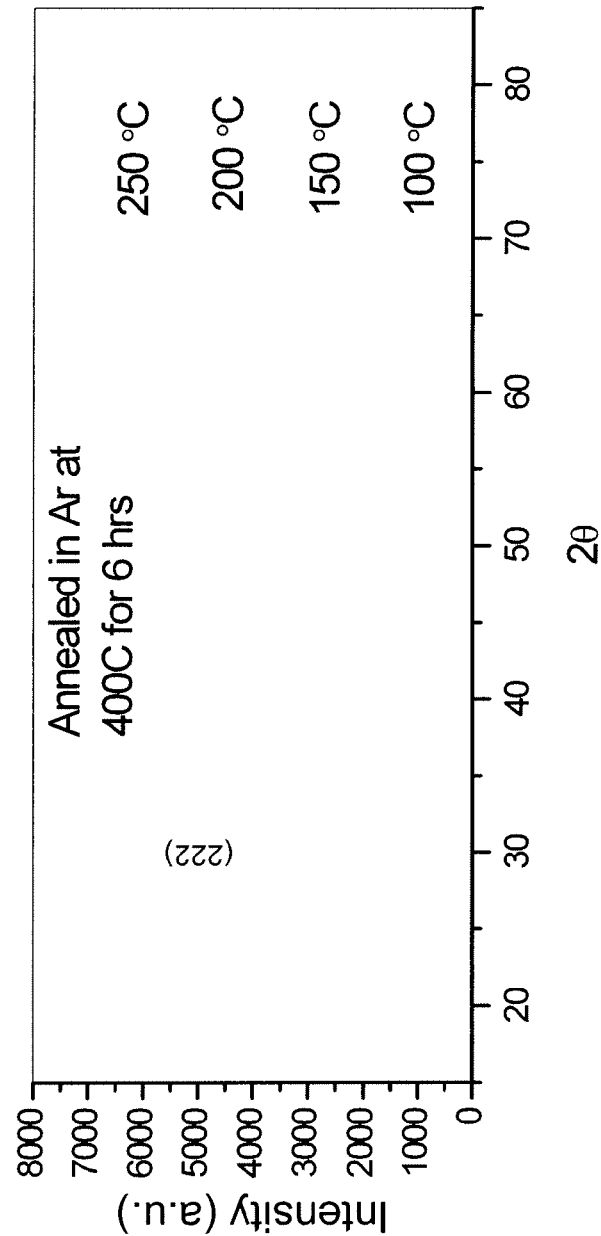
FIG. 14A
FIG. 14B

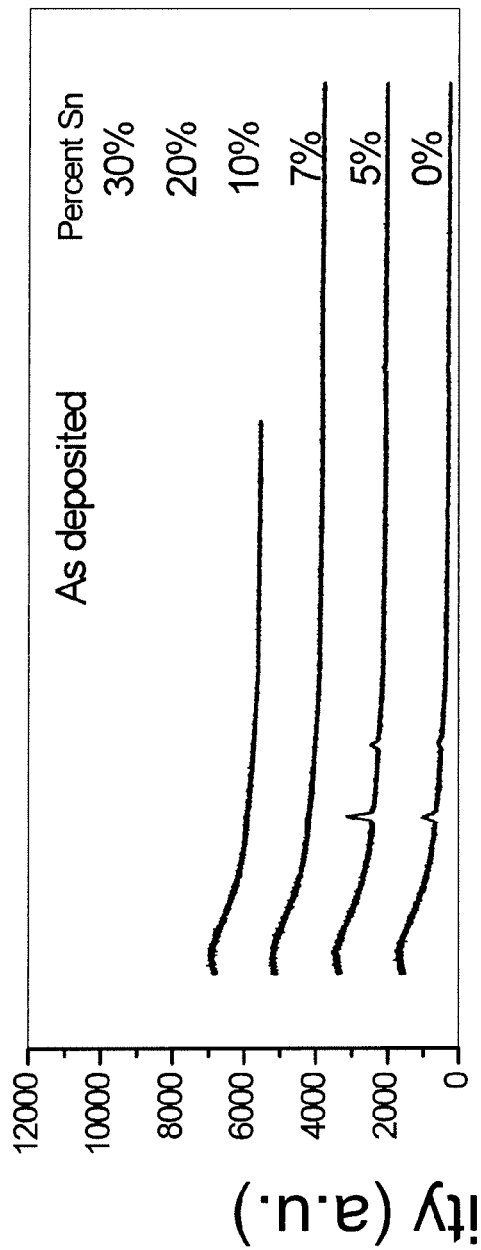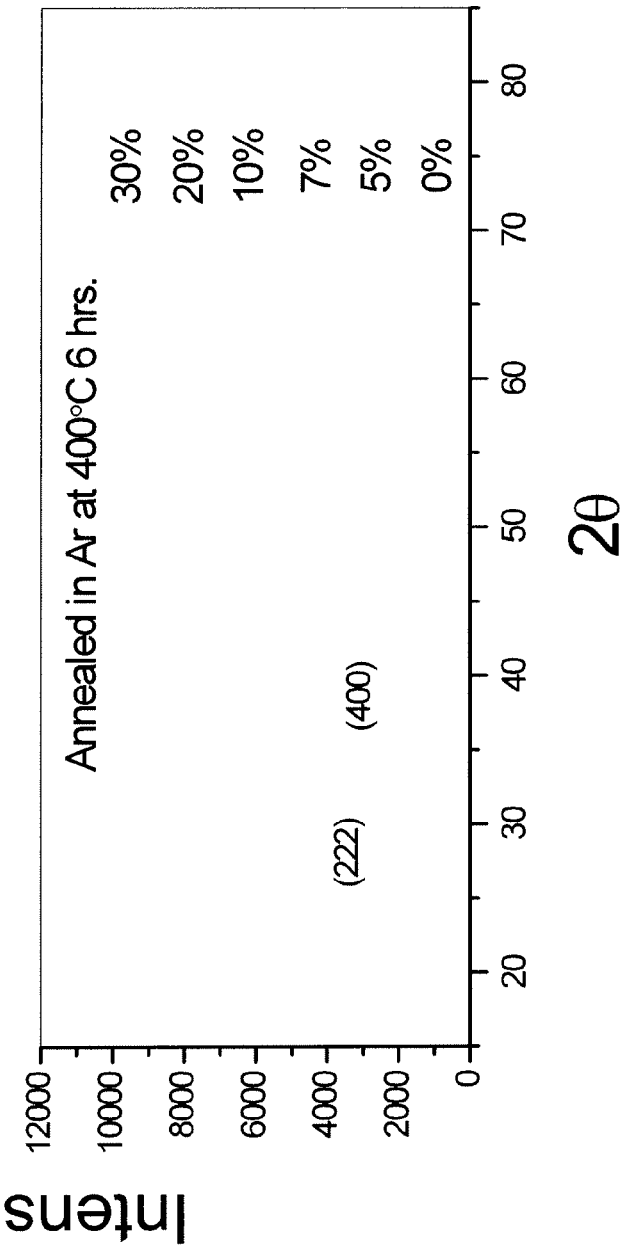
FIG. 25A
FIG. 25B

METHOD FOR PRODUCING HIGHLY CONFORMAL TRANSPARENT CONDUCTING OXIDES

STATEMENT OF GOVERNMENT INTEREST

The United States Government claims certain rights in this invention pursuant to Contract No. W-31-109-ENG-38 between the United States Government and the University of Chicago and/or pursuant to DE-AC02-06CH11357 between the Untied States Government and UChicago Argonne, LLC representing Argonne National Laboratory.

FIELD OF THE INVENTION

This invention relates to a method and system for producing transparent conducting oxides. More particularly the invention relates to methods and systems for producing a variety of highly conformal transparent conducting oxides, such as, indium oxide, indium tin oxide, indium zinc oxide and tin zinc oxide.

BACKGROUND OF THE INVENTION

Transparent conducting oxides ("TCOs") are important components for many applications, such as but not limited to: photovoltaic cells, flat panel displays, touch screens and architectural glass. Current methods of deposition, such as sputtering, are typically used; but production costs are in need of reduction; and quality of the product films need to be improved for various applications and also for providing layer uniformity over large areas. Previously, $In_2O_3$ deposition by ALD has been accomplished using $InCl_3$ with either $H_2O$ or $H_2O_2$ as the oxygen source. Although useful for coating planar surfaces, this method suffers from several limitations. First, the $InCl_3$ chemistry requires high growth temperatures of 300° C. to 500° C., and yields a low growth rate of only 0.25-0.40 Å/cycle. In addition, the $InCl_3$ has a very low vapor pressure and must be heated to 285° C. just to saturate a planar surface. Furthermore, the corrosive HCl by-product can damage the deposition equipment. But the greatest limitation of the $InCl_3/H_2O$ method, especially for coating nanoporous materials, is that $InCl_3$ can etch the deposited $In_2O_3$. Consequently, nanoporous materials require very long precursor exposures that are likely to completely remove the $In_2O_3$ from the outer portions of the nanoporous substrate.

An improved ALD process for $In_2O_3$ has also been sought for many years and a number of alternate precursors have been investigated including β-diketonates $(In(hfac)_3$ (hfac=hexafluoropentadionate), $In(thd)_3$ (thd=2,2,6,6-teramethyl-3,5-heptanedioneate), and $In(acac)_3$ (acac=2,4-pentanedionate)) and trimethyl indium $(In(CH_3)_3)$. Unfortunately, these efforts were unsuccessful. No growth was observed using β-diketonates with water or hydrogen peroxide, while trimethyl indium did not yield self-limiting growth.

SUMMARY OF THE INVENTION

An improved method and system for producing indium oxide $(In_2O_3)$ and other transparent conducting oxides is provided by the instant invention. $In_2O_3$ can also be doped with tin to form indium tin oxide ("ITO") with improved electrical conductivity, high optical transparency and good chemical stability. Deposition of such materials is accomplished by using atomic layer deposition ("ALD") to deposit ITO (and other such transparent conducting oxides) over large areas with high uniformity to address selected commercial applications. The ALD method is used in conjunction with particular precursor materials, such as trimethyl indium ("TMIn") due to its high vapor pressure, low cost and availability as a commodity. The ALD method is used with TMIn and $O_3$ (ozone). In addition to ITO, other transparent conducting oxides can be prepared including, for example without limitation, doped ITO and tin zinc oxide. These and other features of the invention will be described in more detail hereinafter with reference to the figures described below.

BRIEF DESCRIPTION OF THE DRAWINGS

FIG. 4A shows deposition data of $In_2O_3$ by use of TMIn and $H_2O$;

FIG. 4B shows deposition data of $In_2O_3$ by use of TMIn and $H_2O_2$;

FIG. 4C shows deposition data of $In_2O_3$ by use of TMIn and $O_2$;

FIG. 4D shows deposition data of TMIn and $O_3$ (ozone); and

FIGS. 5A(1)-5A(5) shows process cycle conditions and

FIG. 7A(1)-7A(4) illustrates deposition data of ALD $In_2O_3$ using TMIn and $O_3$ self limiting behavior growth;

FIG. 14A shows an X-ray diffraction pattern for as deposited ALD layers of $In_2O_3$ deposited at selected temperatures; and FIG. 14B shows these same layers after annealing at 400° C. for 6 h;

FIG. 25A shows X-ray diffraction patterns for as deposited ITO with various % Sn content;

FIG. 25B shows the ITO after annealing;

DETAILED DESCRIPTION OF THE VARIOUS EMBODIMENTS

Figure 1:
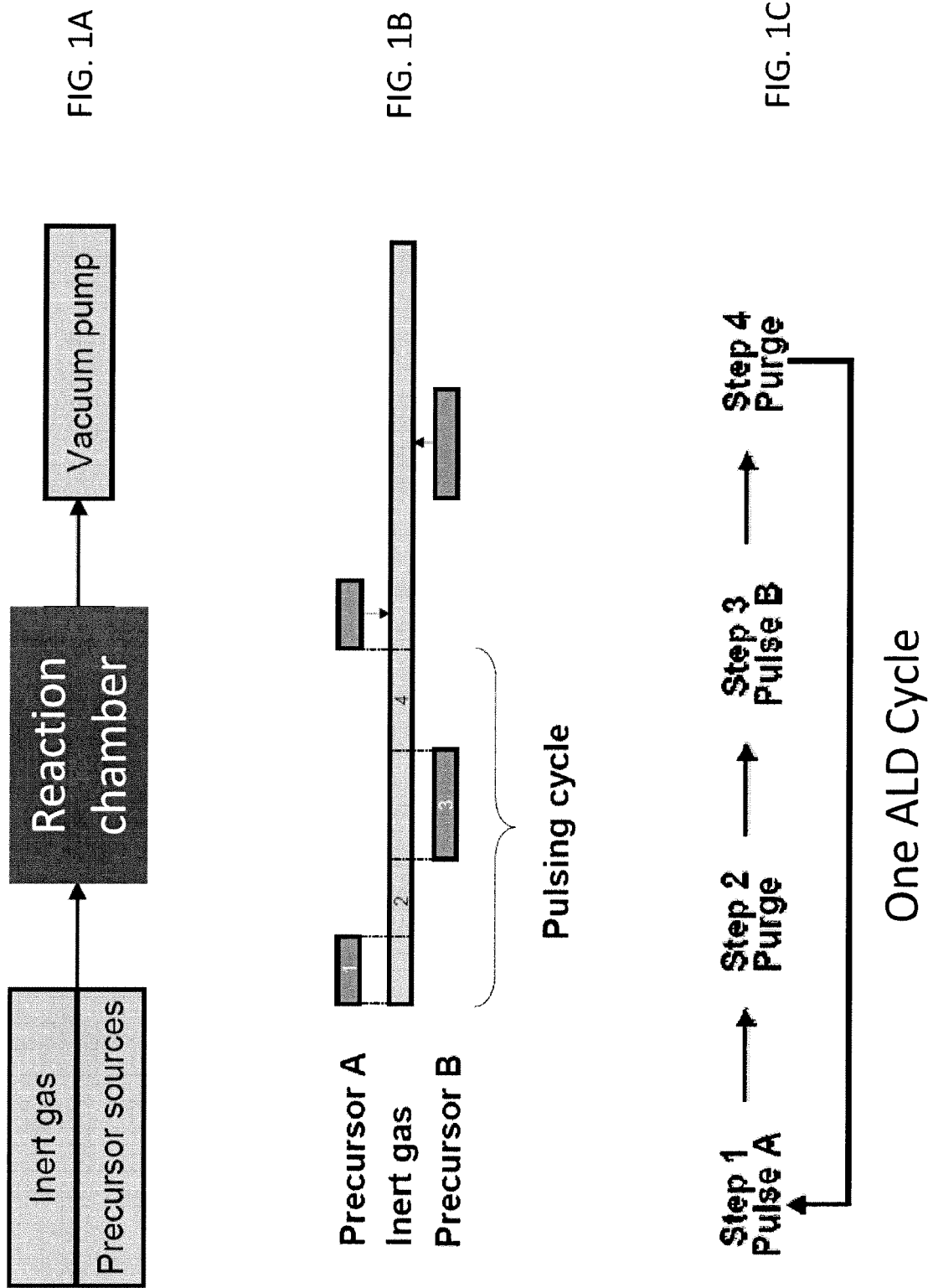
FIG. 1A illustrates a flow diagram of ALD.
FIG. 1B illustrates a gas pulsing cycle during ALD.
FIG. 1C illustrates one cycle of an ALD process.

In one form of the invention a system 10 is shown in FIG. 1A which illustrates a flow diagram of an atomic layer deposition ("ALD") process used to form layers of transparent conducting oxides. In the system, 10 various gas sources are provided, such as for example, precursor sources 20 and inert gas 30 which are selectively output to reaction chamber 40. Vacuum pump 50 enables control of the vacuum level and/or pressure level of gases input to the reaction chamber 40. FIG. 1B illustrates an example of a cycle of gas level pulses during an ALD deposition cycle. FIG. 1C shows schematically one ALD cycle of gas pulsing and purges of the reaction chamber 40.

Figure 2:
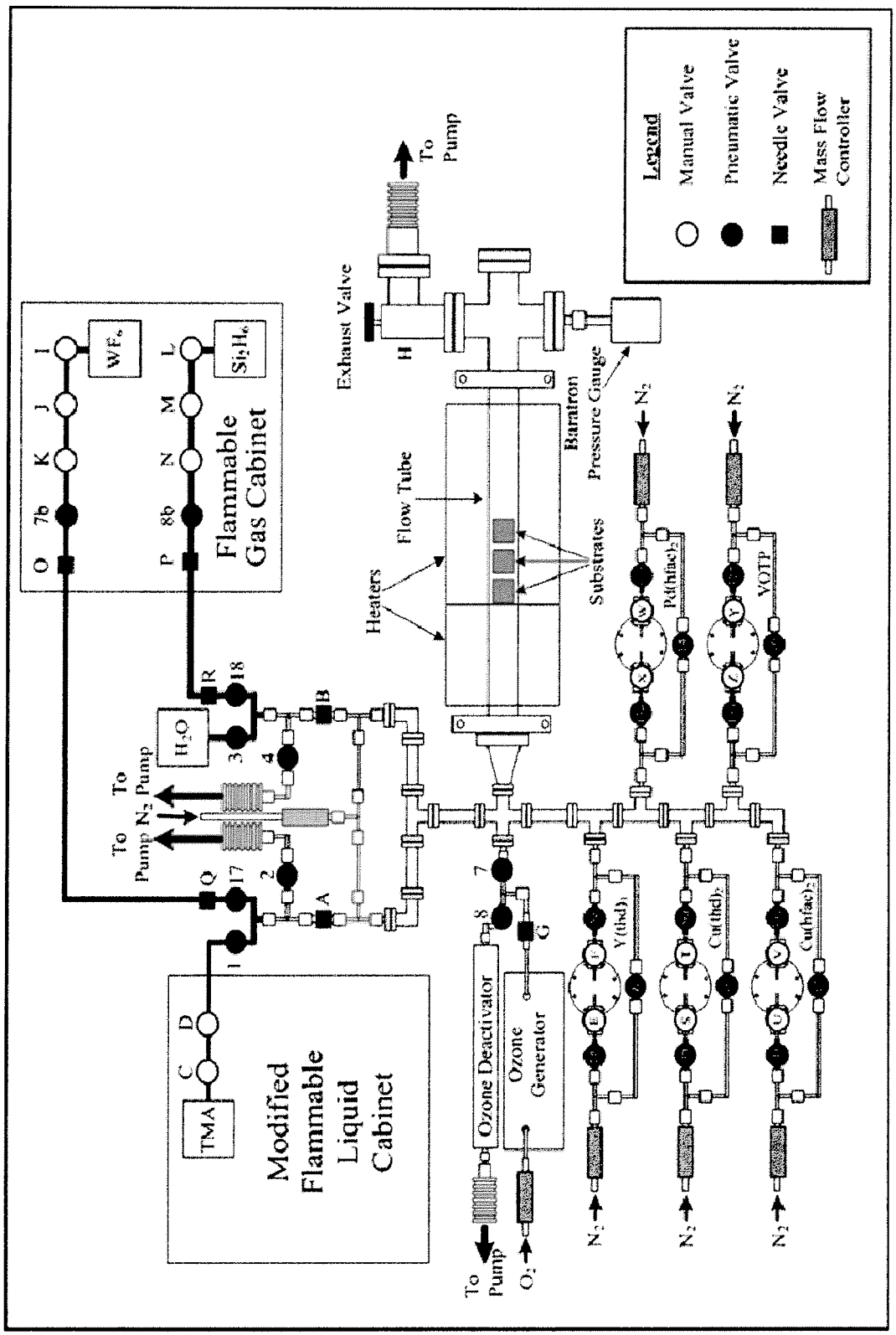
FIG. 2 illustrates an ALD reactor system.
Figure 3:
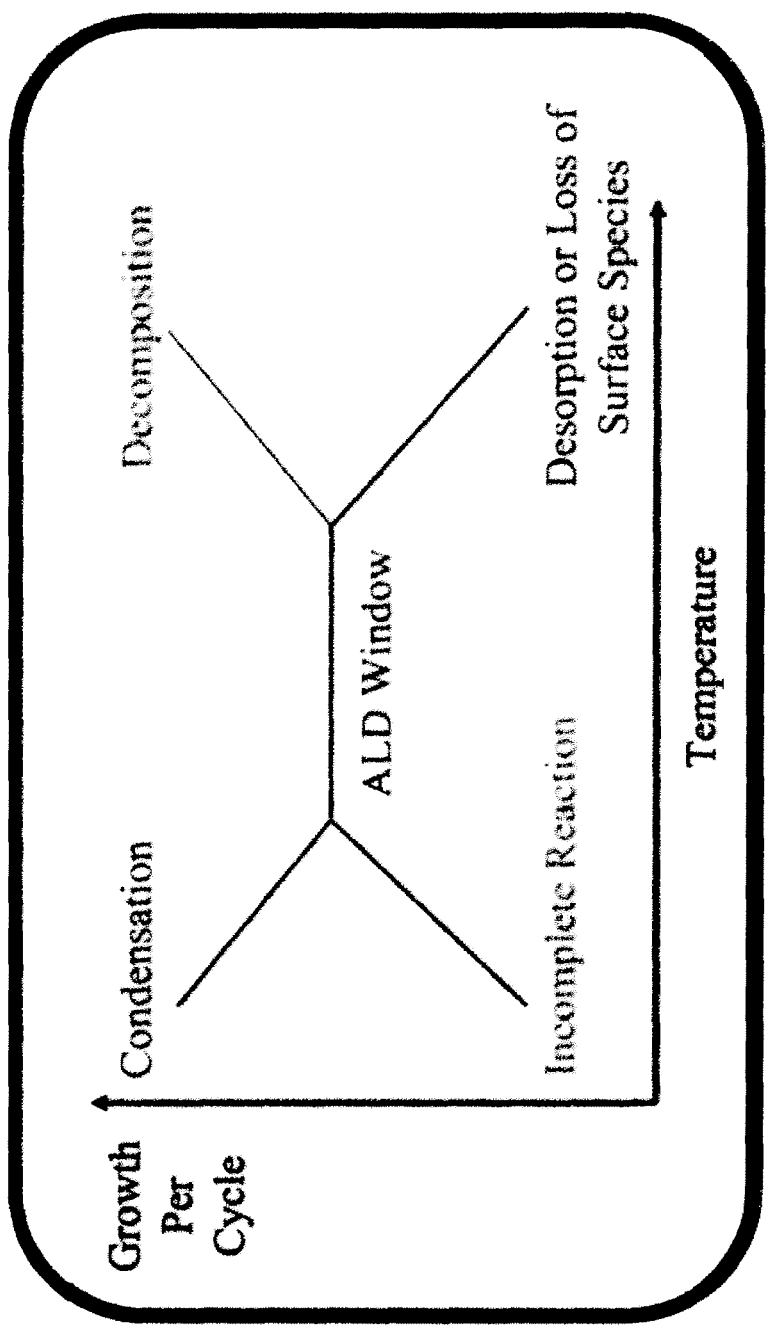
FIG. 3 illustrates schematically the ALD process temperature window.
Figure 4E:
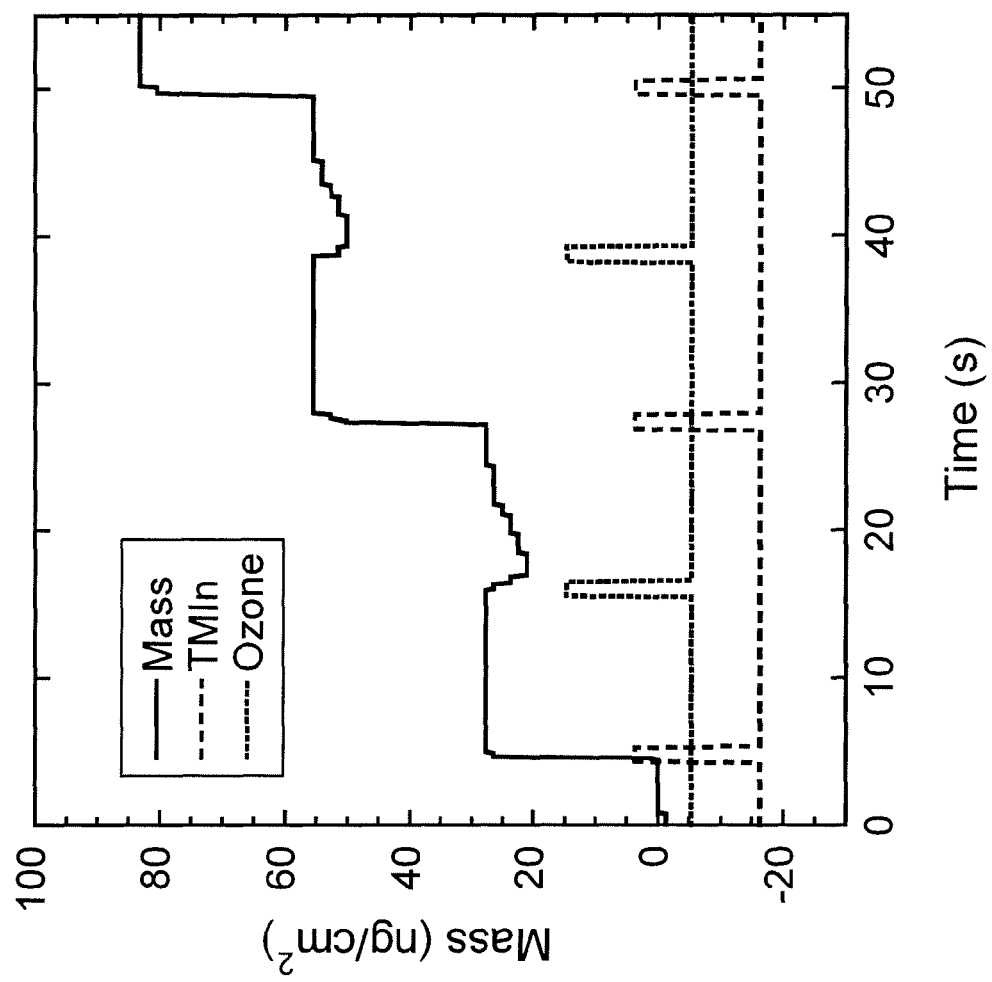
FIG. 4E shows deposition data of TMIn and $O_3$ for two ALD cycles (magnified image of FIG. 4D)
Figure 5B:
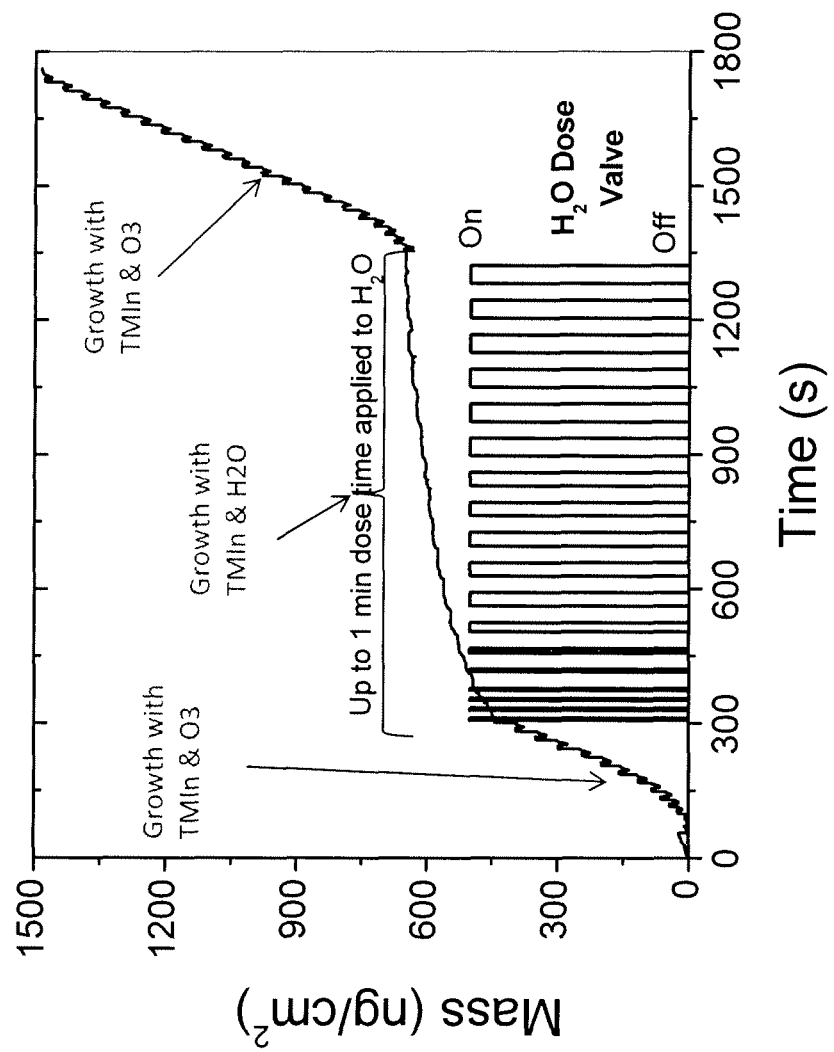
FIG. 5B show comparative growth for $In_2O_3$ by TMIn with $H_2O$ and $O_3$.
Figure 6:
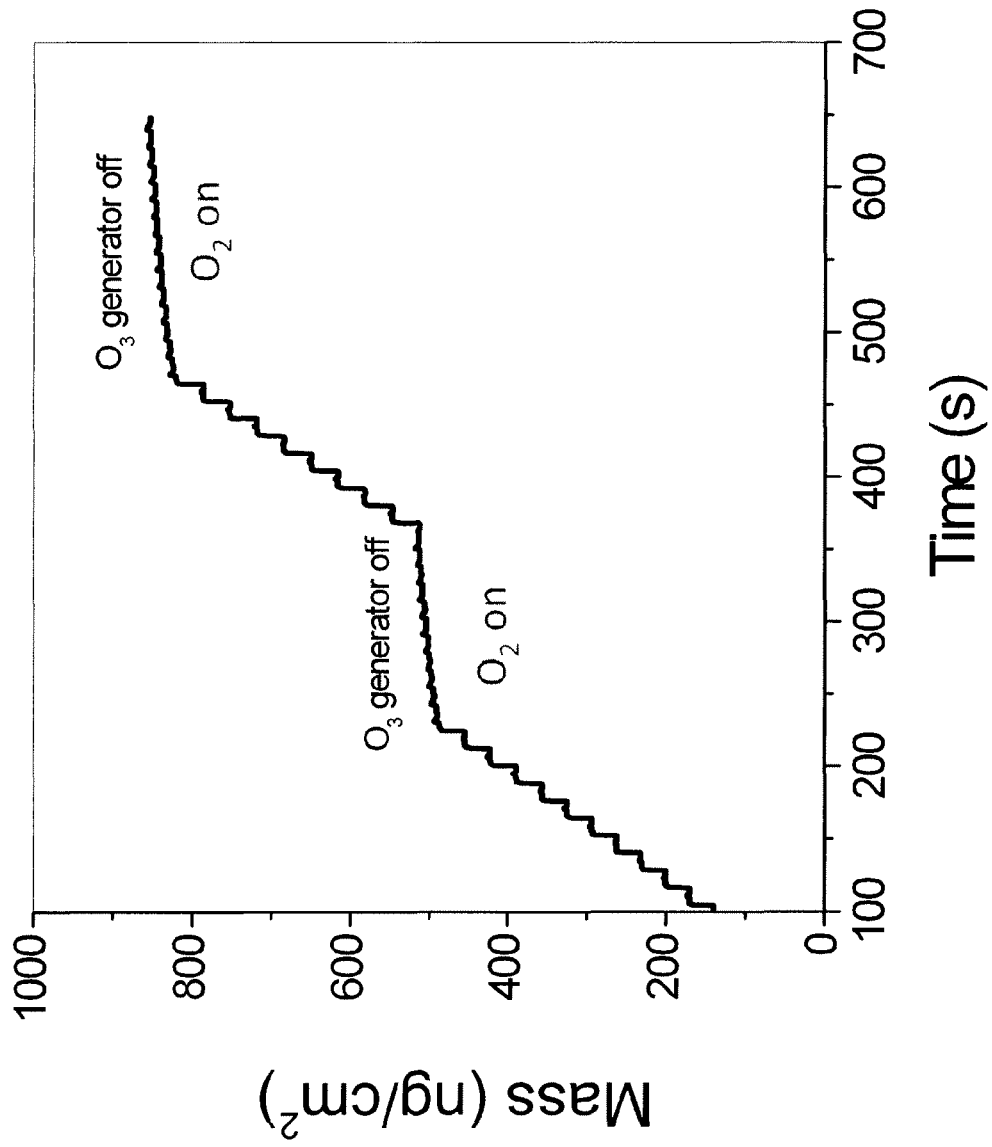
FIG. 6 show comparative growth for $In_2O_3$ by TMIn with dosing $O_3$ or $O_2$.
Figure 8A:
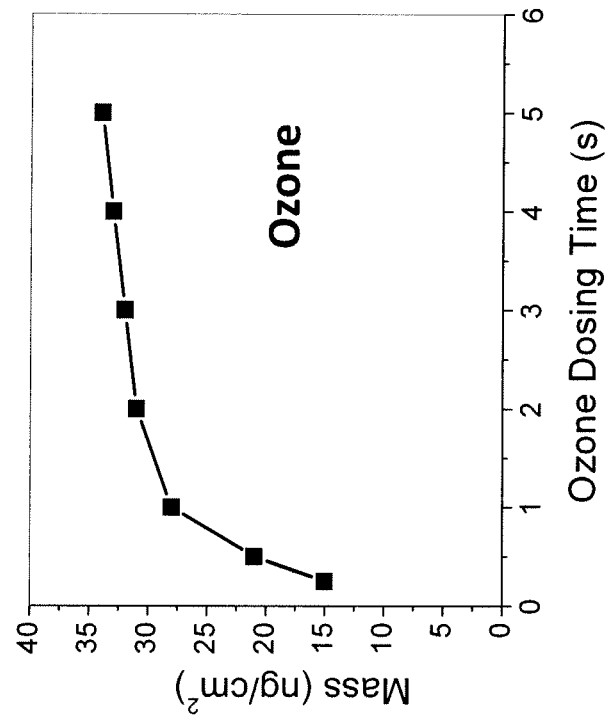
FIG. 8A shows ALD $In_2O_3$ growth saturation data using TMIn.
Figure 8B:
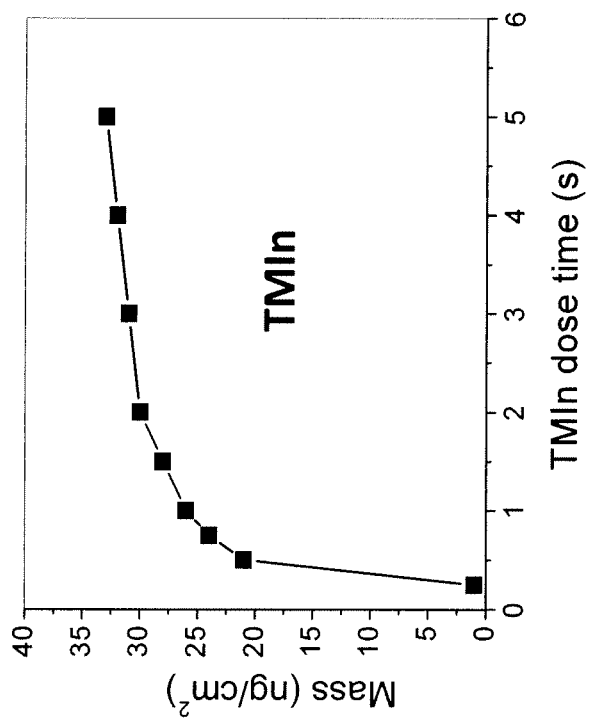
FIG. 8B shows ALD growth saturation data using $O_3$.
Figure 9B:
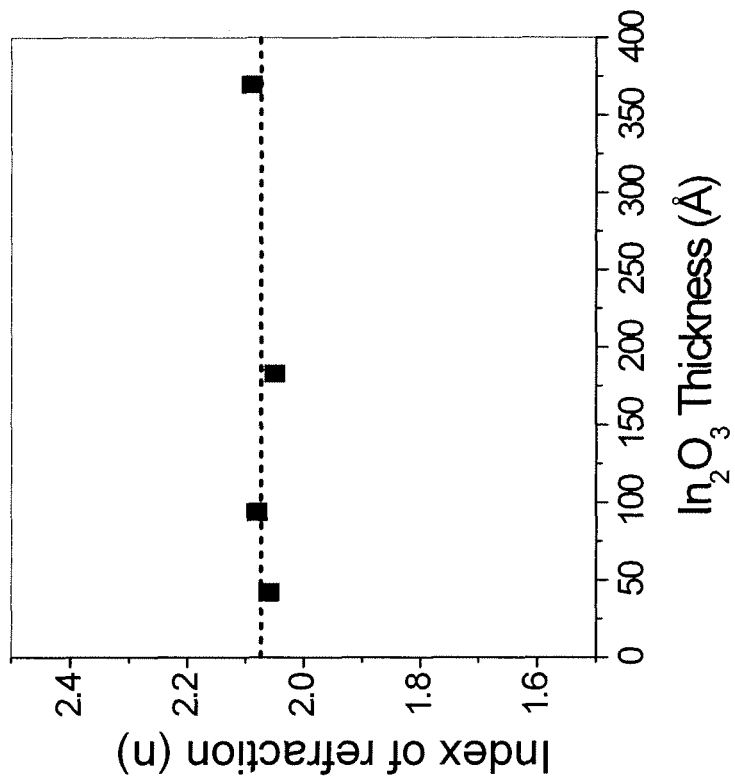
FIG. 9B shows index of refraction versus $In_2O_3$ thickness.
Figure 9A:
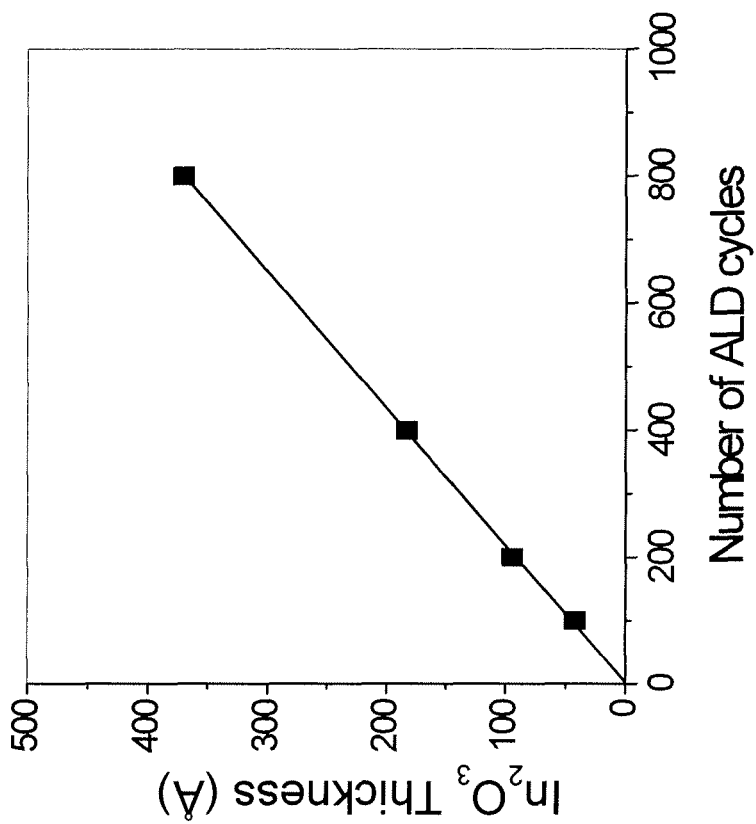
FIG. 9A shows $In_2O_3$ thickness versus number of ALD cycles.
Figure 9C:
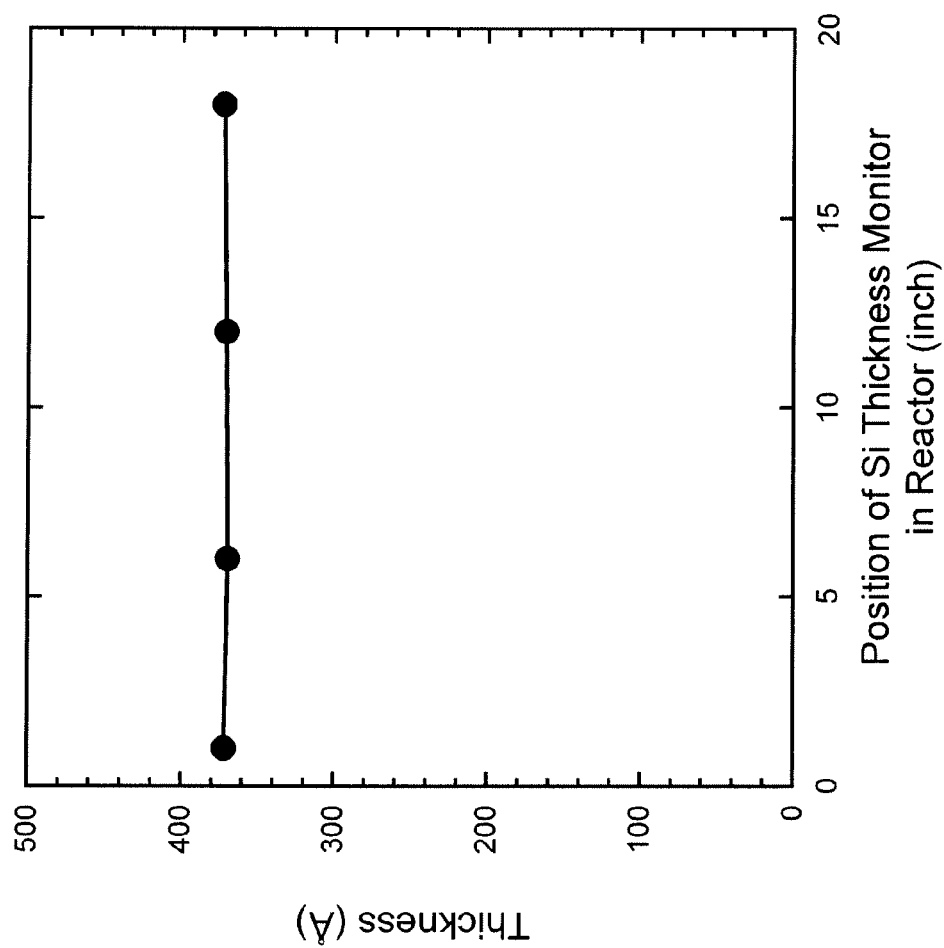
FIG. 9C shows $In_2O_3$ thickness across a deposition surface.
Figure 10B:
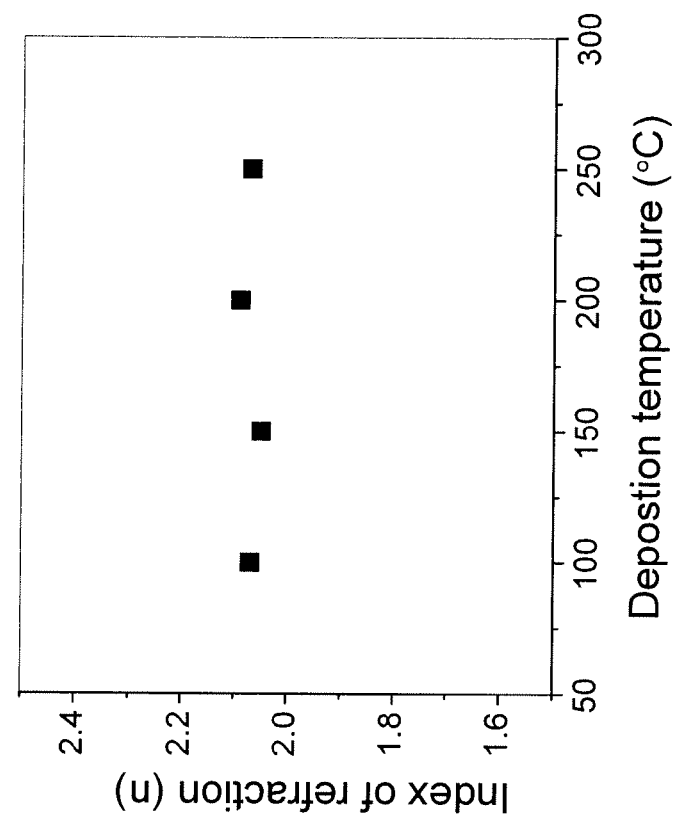
FIG. 10B shows index of refraction of $In_2O_3$ versus deposition temperatures.
Figure 10A:
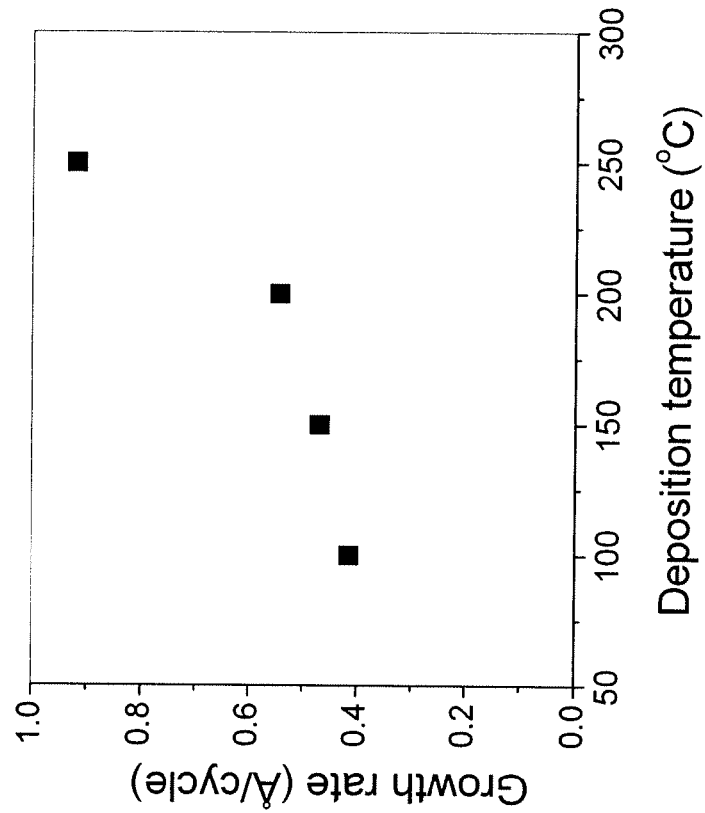
FIG. 10A shows $In_2O_3$ growth rate versus deposition temperature.
Figure 11A:
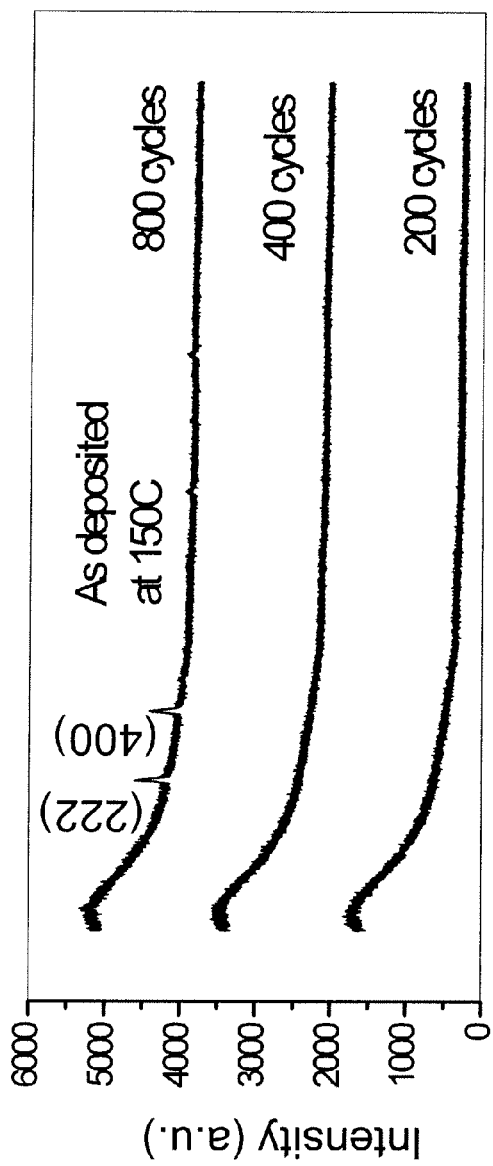
FIG. 11A shows an X-ray diffraction pattern for as deposited $In_2O_3$ at 150° C.
Figure 11B:
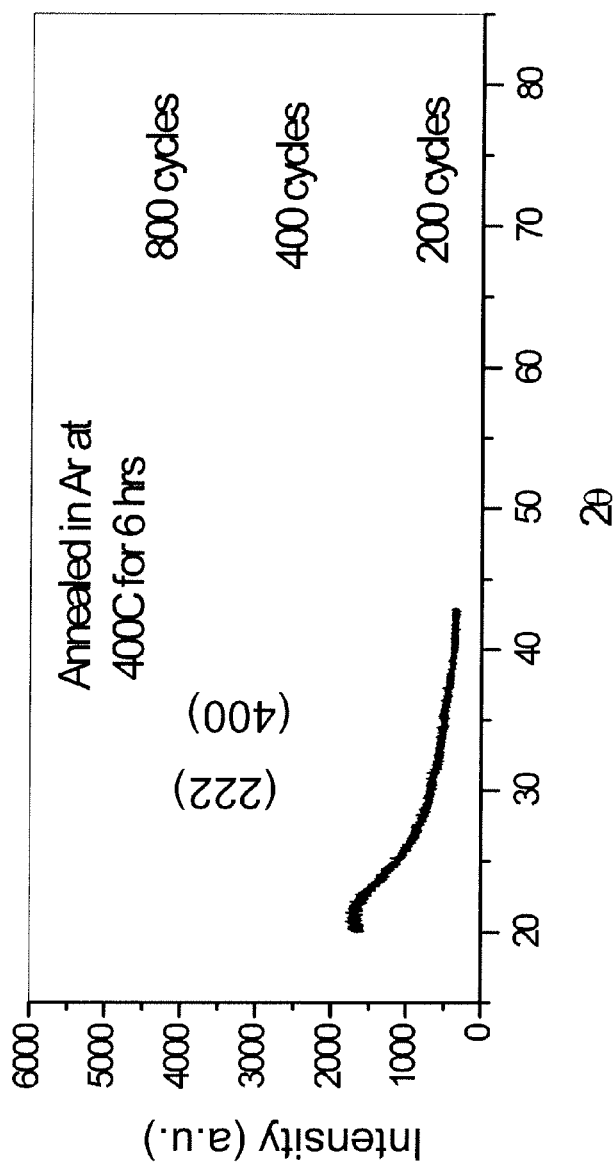
FIG. 11B shows the layer of FIG. 11A annealed at 400 C for 6 h.
Figures 12A, 12B:
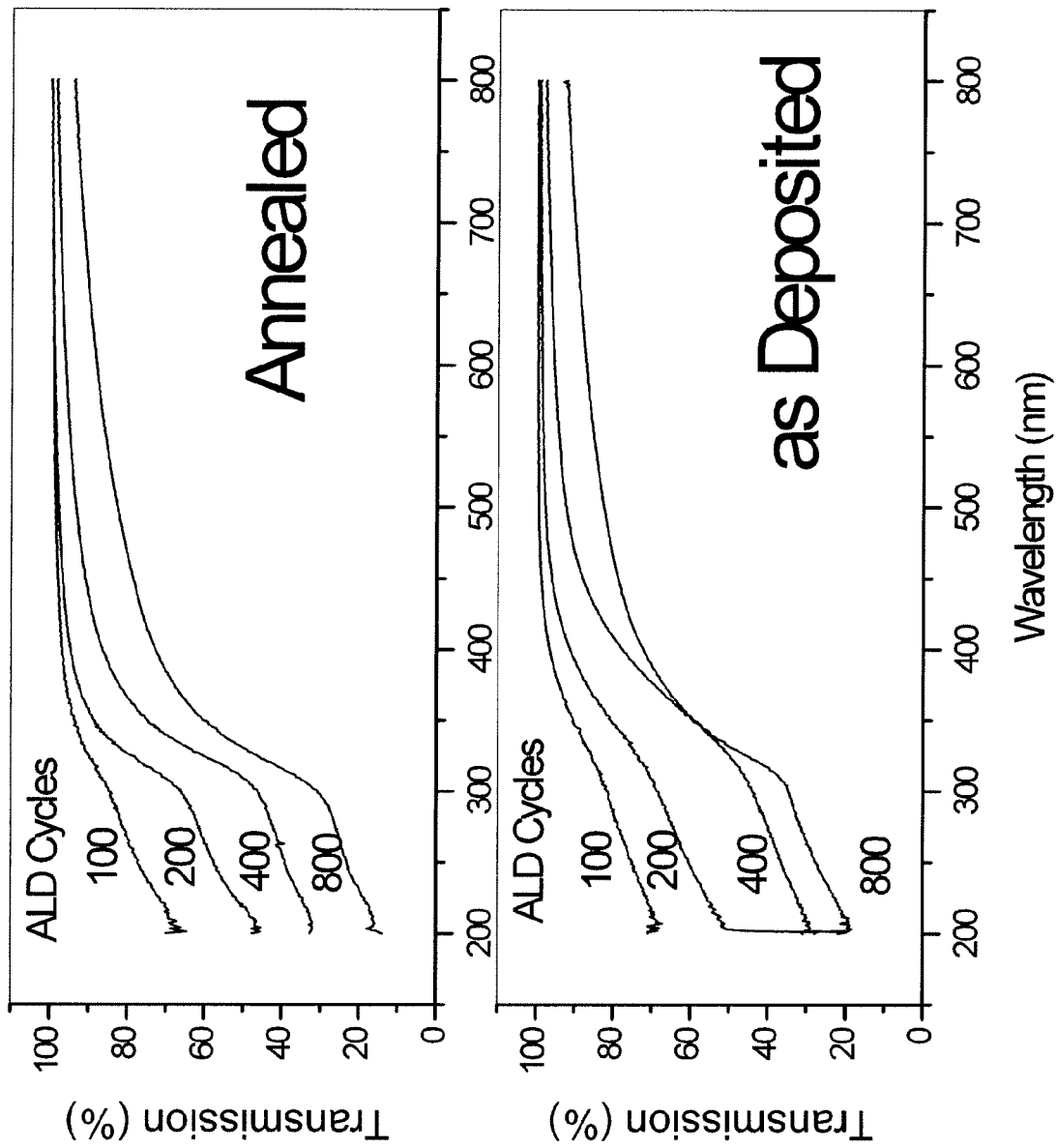
FIG. 12A shows transmission percent as a function of wavelength for $In_2O_3$ layers at various ALD cycles and annealed.
FIG. 12B shows transmission percent for various as deposited cycles of ALD.
Figures 13A, 13B, 13C:
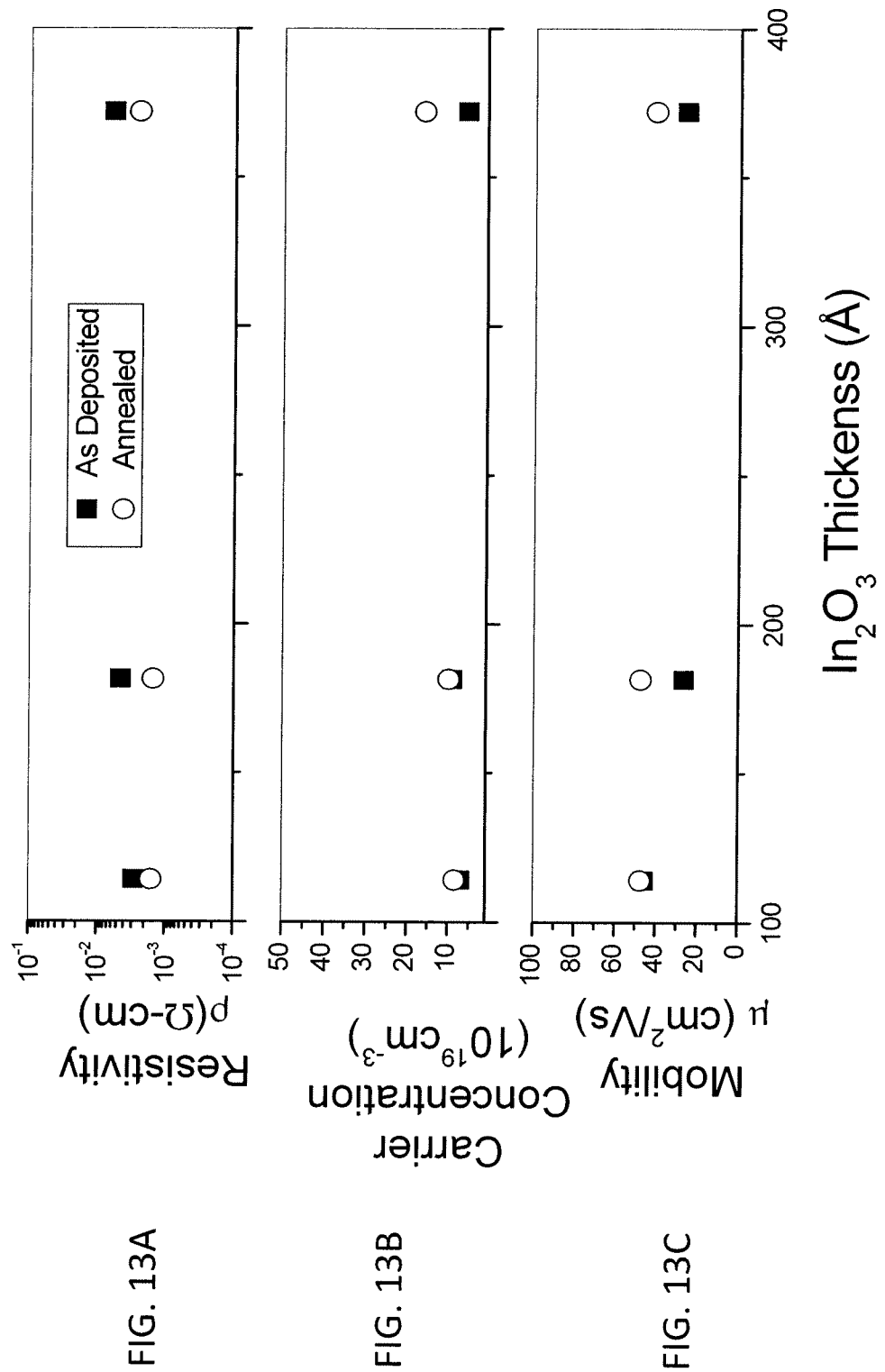
FIG. 13A shows $In_2O_3$ resistivity as a function of layer thickness.
FIG. 13B shows carrier concentration as a function of layer thickness.
FIG. 13C shows Hall mobility as a function of layer thickness.
Figures 15A, 15B, 15C:
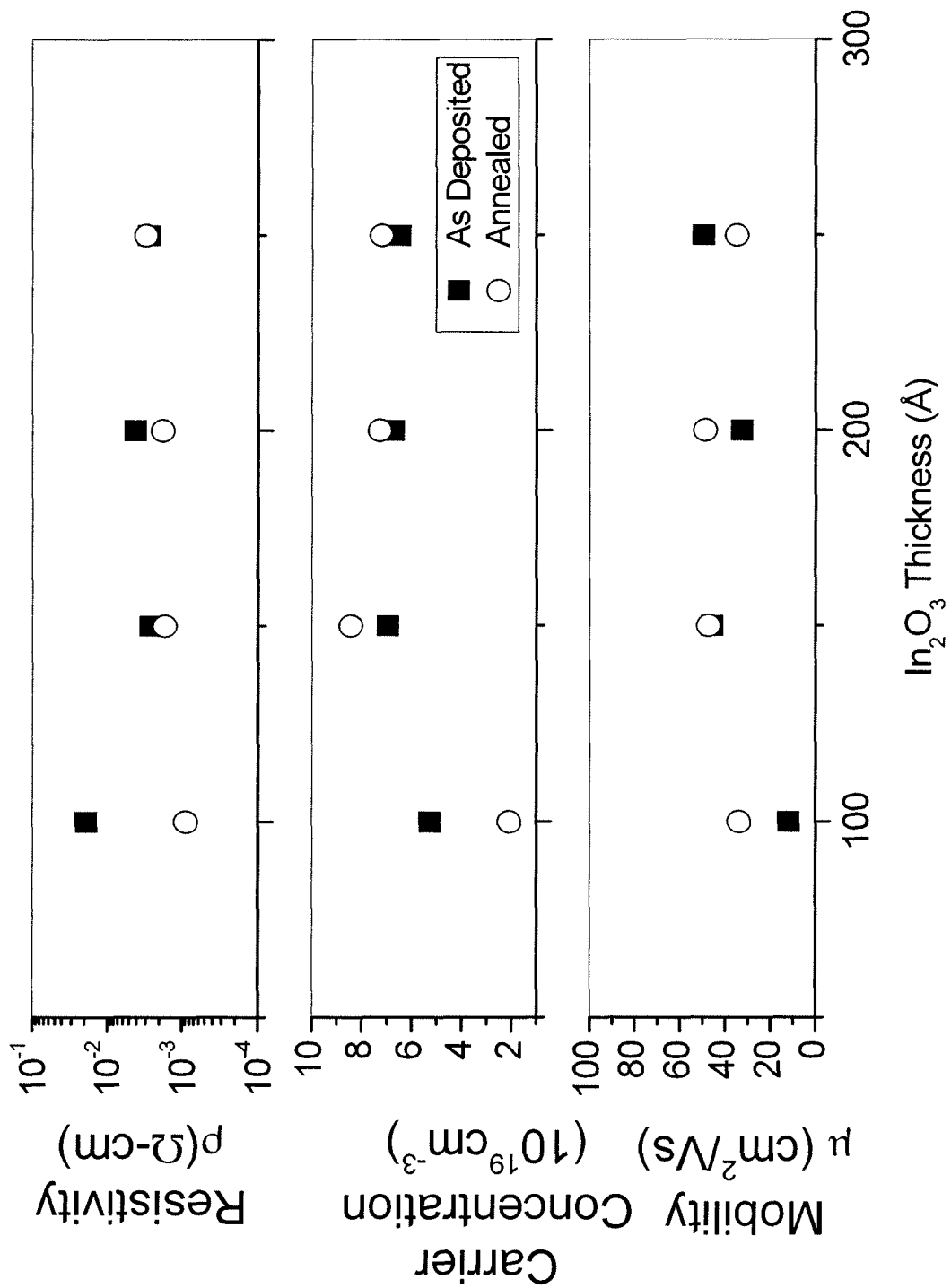
FIG. 15A shows resistivity for $In_2O_3$ before and after annealing.
FIG. 15B shows carrier concentration for $In_2O_3$ before and after annealing.
FIG. 15C shows Hall mobility before and after annealing.
Figure 16A:
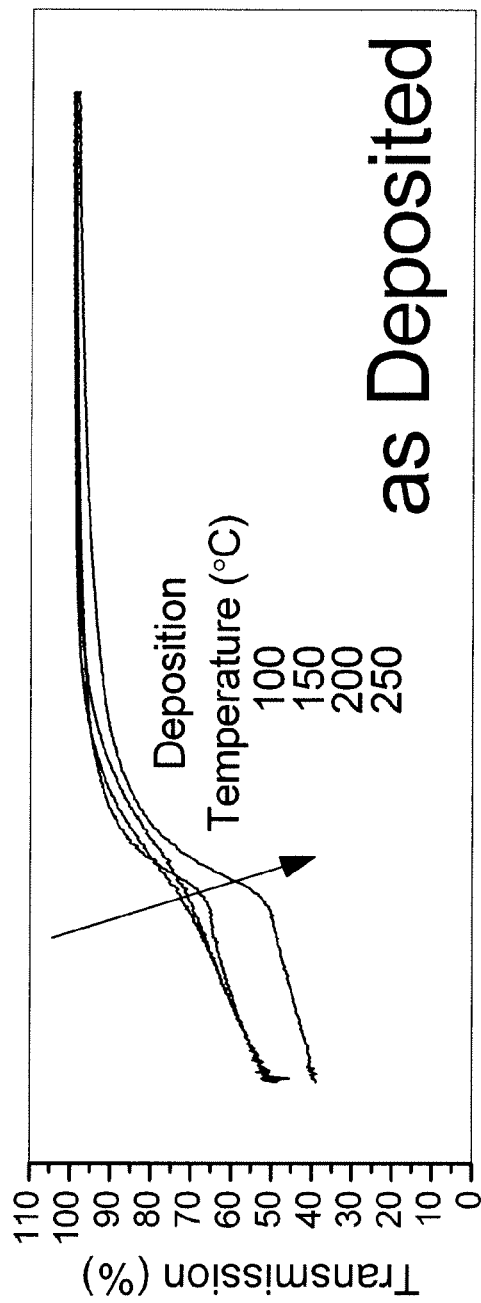
FIG. 16A shows percent transmittance for $In_2O_3$ layers deposited at various temperatures.
Figure 16B:
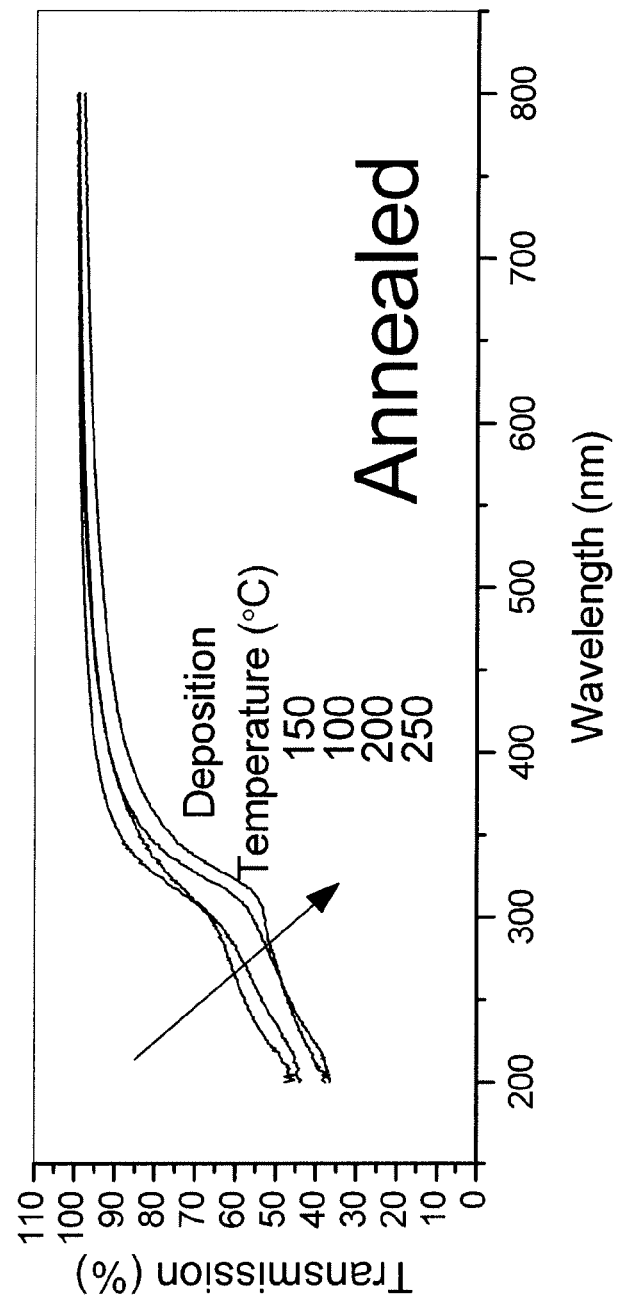
FIG. 16B shows transmittance after being annealed.
Figure 17A:
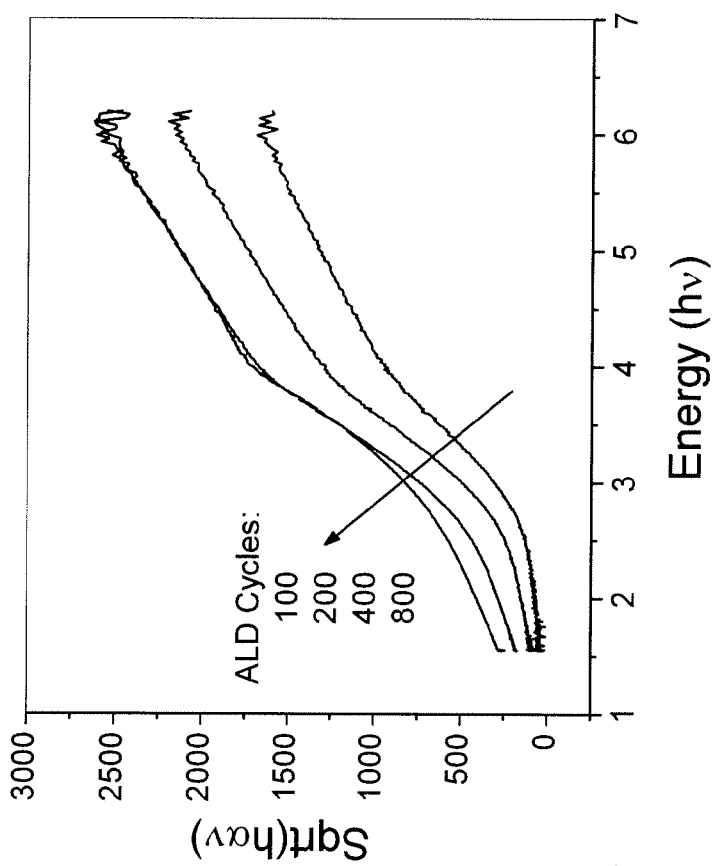
FIG. 17A Tauc plot calculated from FIG. 16A for $In_2O_3$ layers as deposited at various temperatures and FIG. 17B Tauc plot calculated for $In_2O_3$ layers as deposited at various number of ALD cycles.
Figure 17B:
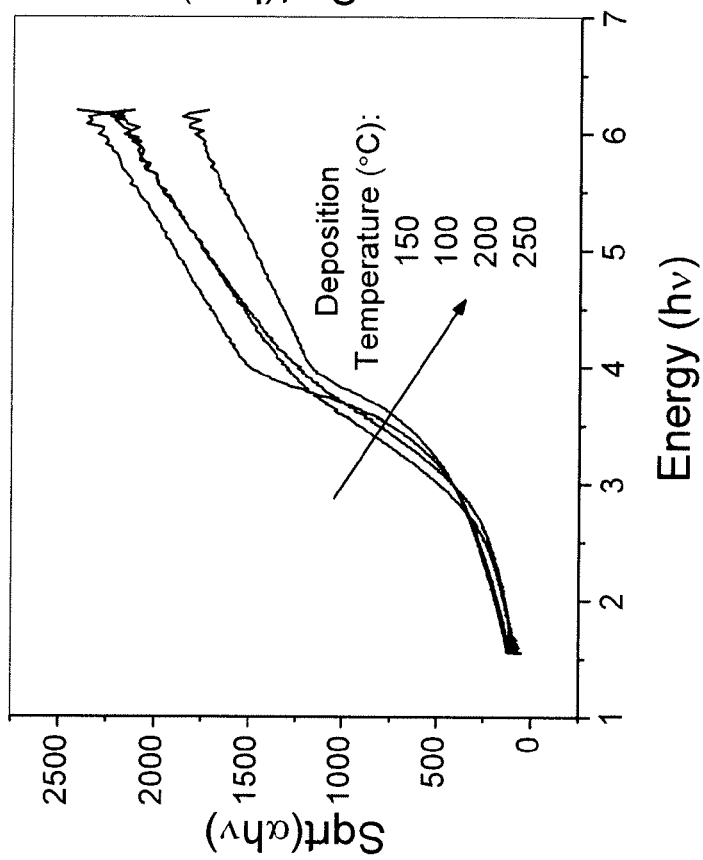

FIG. 2 illustrates further detail of a preferred form of an ALD system 60. The fundamentals of an ALD system are described in U.S. Pat. No. 4,058,430 which is incorporated by referenced herein. In the system 60 a reaction chamber 70 includes heaters 80, a flow tube 90 within which are disposed samples 100. Various precursor sources 110, 120 and 130 provide reactants and purge gases to the reaction chamber 70. The sources 110 can include, for example, trimethyl indium ("TMIn"), ozone ($O_3$), tin oxide ("$SnO_2$") and zinc oxide ("ZnO"). The purge gases of the sources 120 and 130 include for example Ar, $N_2$ and other non-reactive gases. The system 60 further includes various valving systems 140 for processing deposition of selected transparent conducting oxides. In FIG. 3 is shown a schematic of an ALD process temperature window with areas of active ALD as well as condensation, incomplete reaction, decomposition and desorption regions of reaction. Consequently, proper ALD deposition is dependent on a particular temperature window for a growth precursor and desired oxide deposition. In various preferred embodiments described hereinafter, TMIn is applied to produce an $In_2O_3$ layer growth along with doping of $In_2O_3$ by Sn and Zn. Various temperatures were determined to provide productive ALD along with use of $O_3$. In addition, SnO—ZnO layer growth is described hereinafter.

Figure 18:
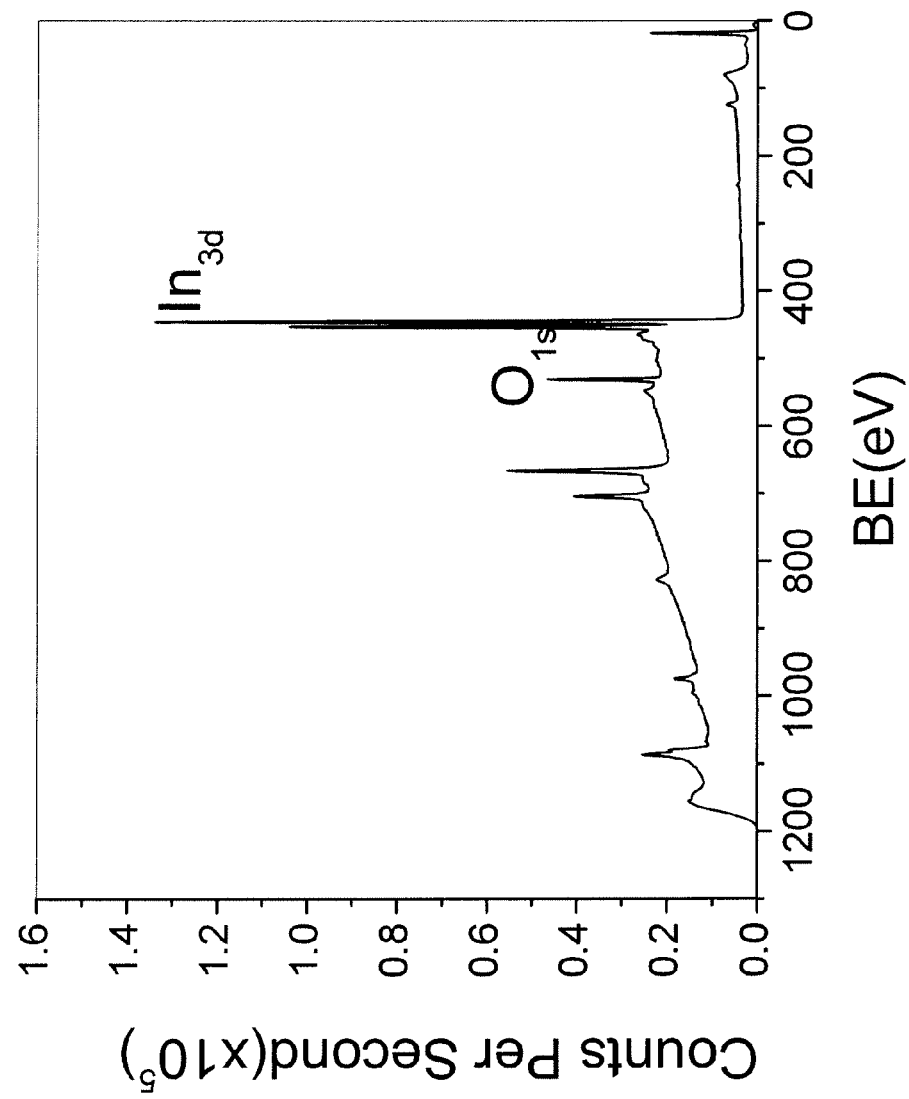
FIG. 18 shows full range XPS scan of $In_2O_3$ after Ar sputter.
Figure 19:
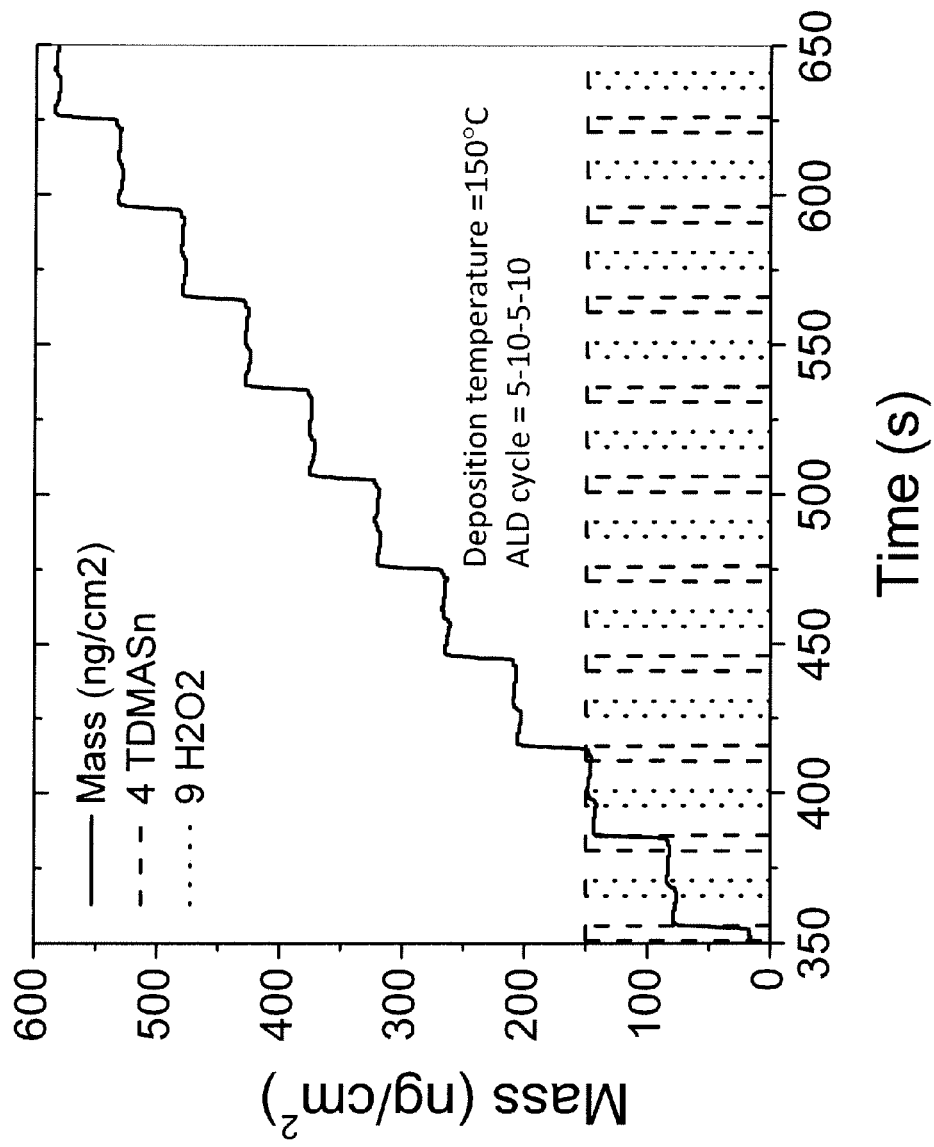
FIG. 19 shows deposition of $SnO_2$ using TDMASn and $H_2O_2$.
Figure 20:
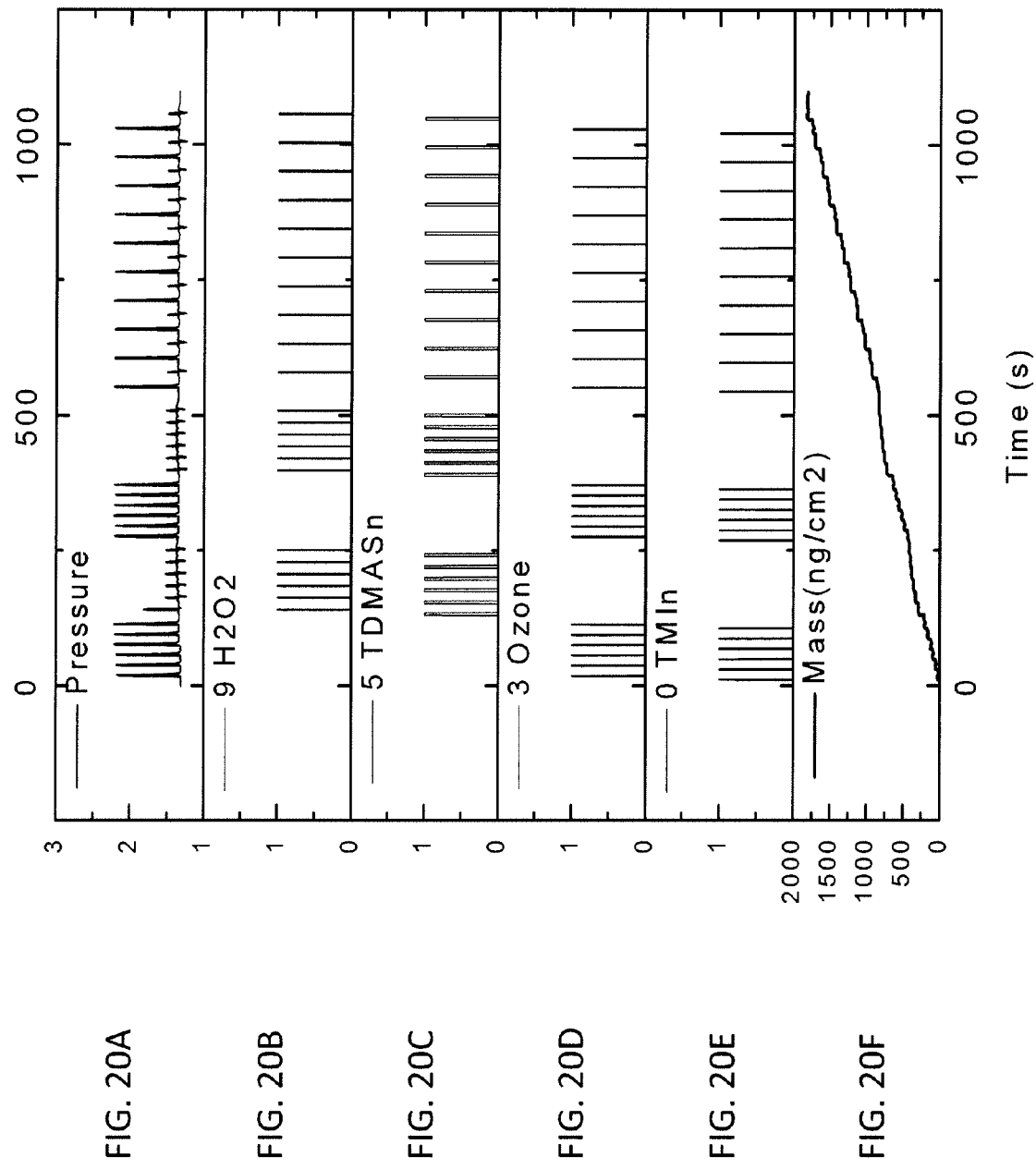
FIGS. 20A-20F show the ALD process for TDMASn with $H_2O_2$ and TMIn with $O_3$.
Figure 21:
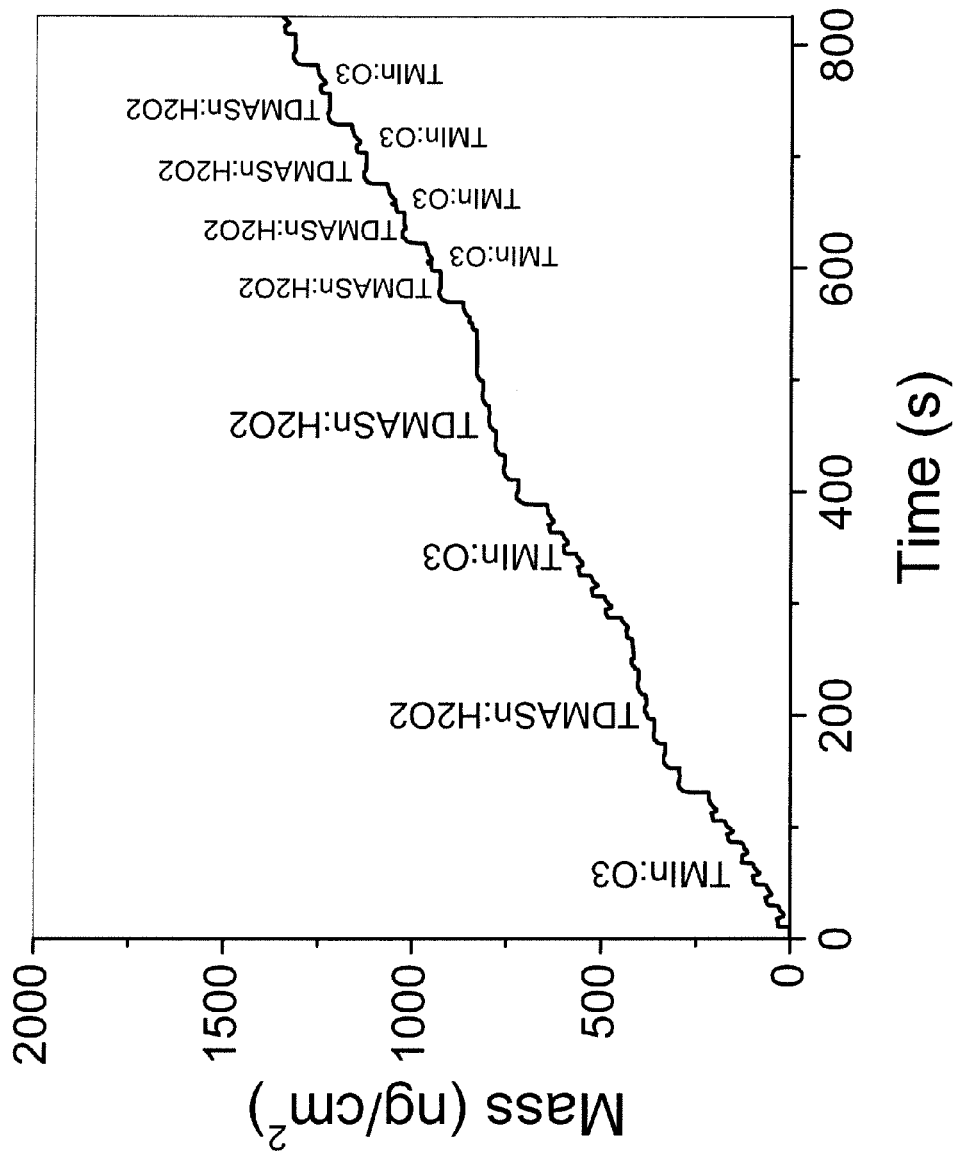
FIG. 21 shows a growth curve for alternate growth of TDMASn with $H_2O_2$ and TMIn with $O_3$.
Figure 22:
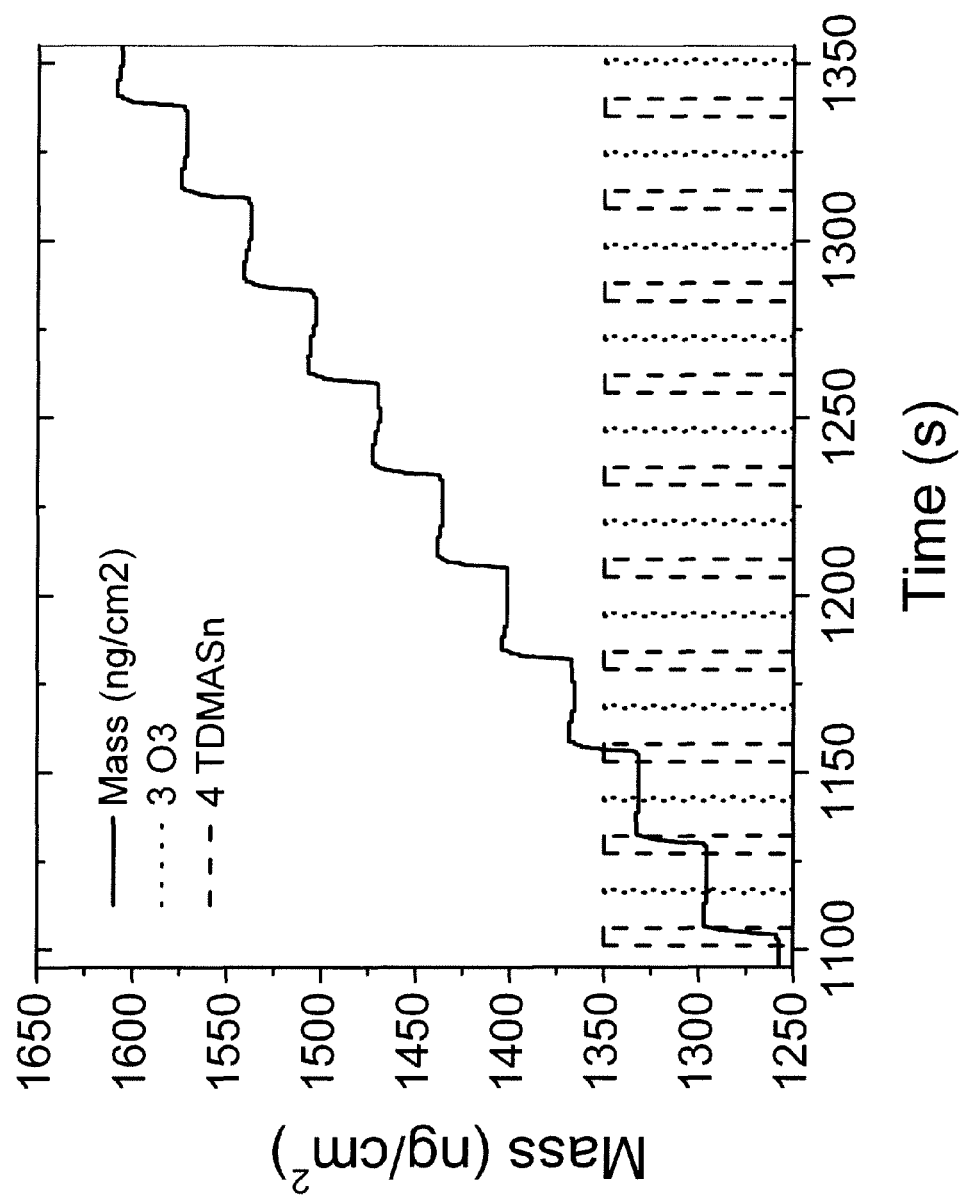
FIG. 22 shows deposition of $SnO_2$ using TDMASn and $O_3$.
Figure 23A:
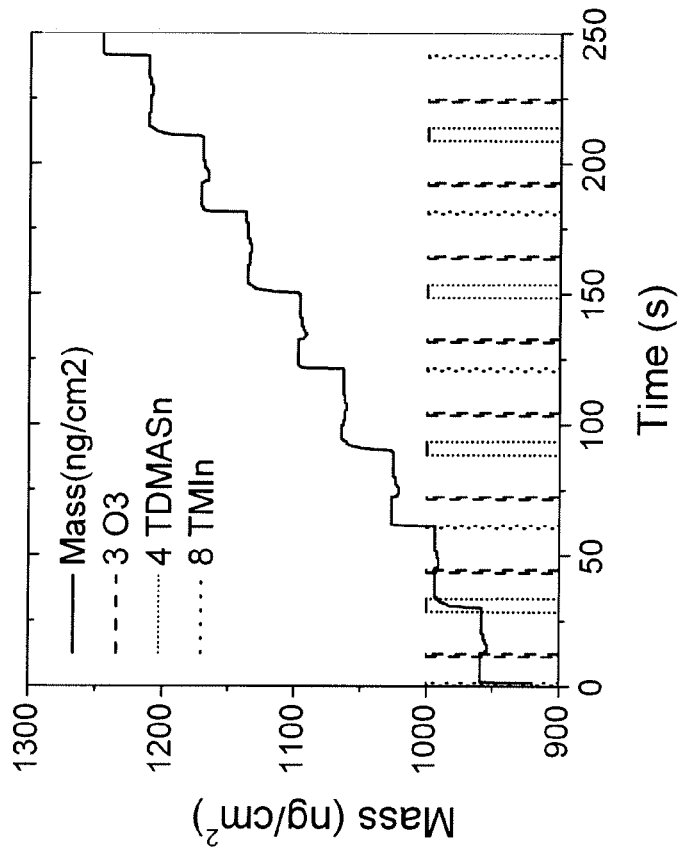
FIG. 23A shows a growth curve over time for TDMASn with $In_2O_3$ and $SnO_2$ cycles of three.
Figure 23B:
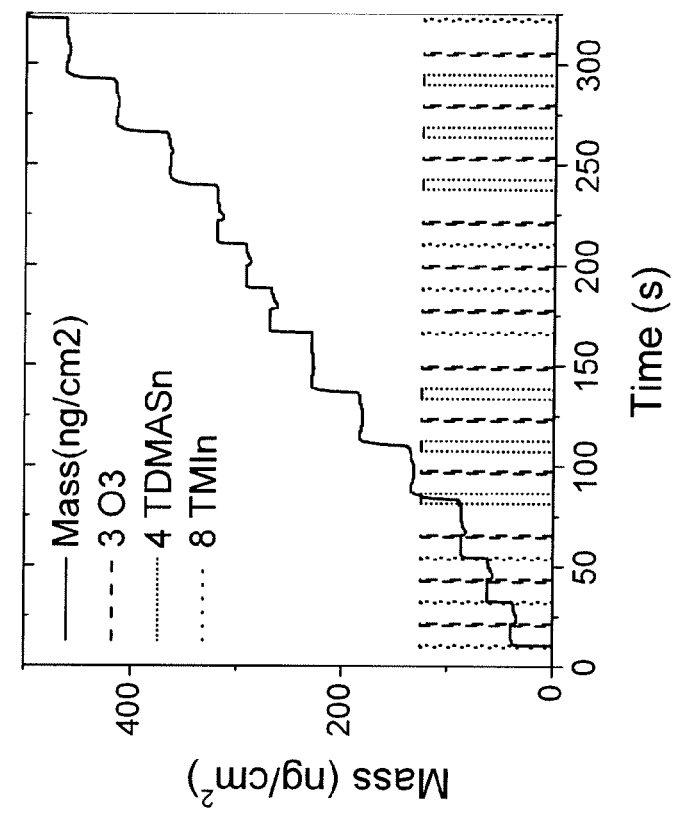
FIG. 23B shows alternate growth of $In_2O_3$ and $SnO_2$ for use of alternate growth cycles.
Figure 24A:
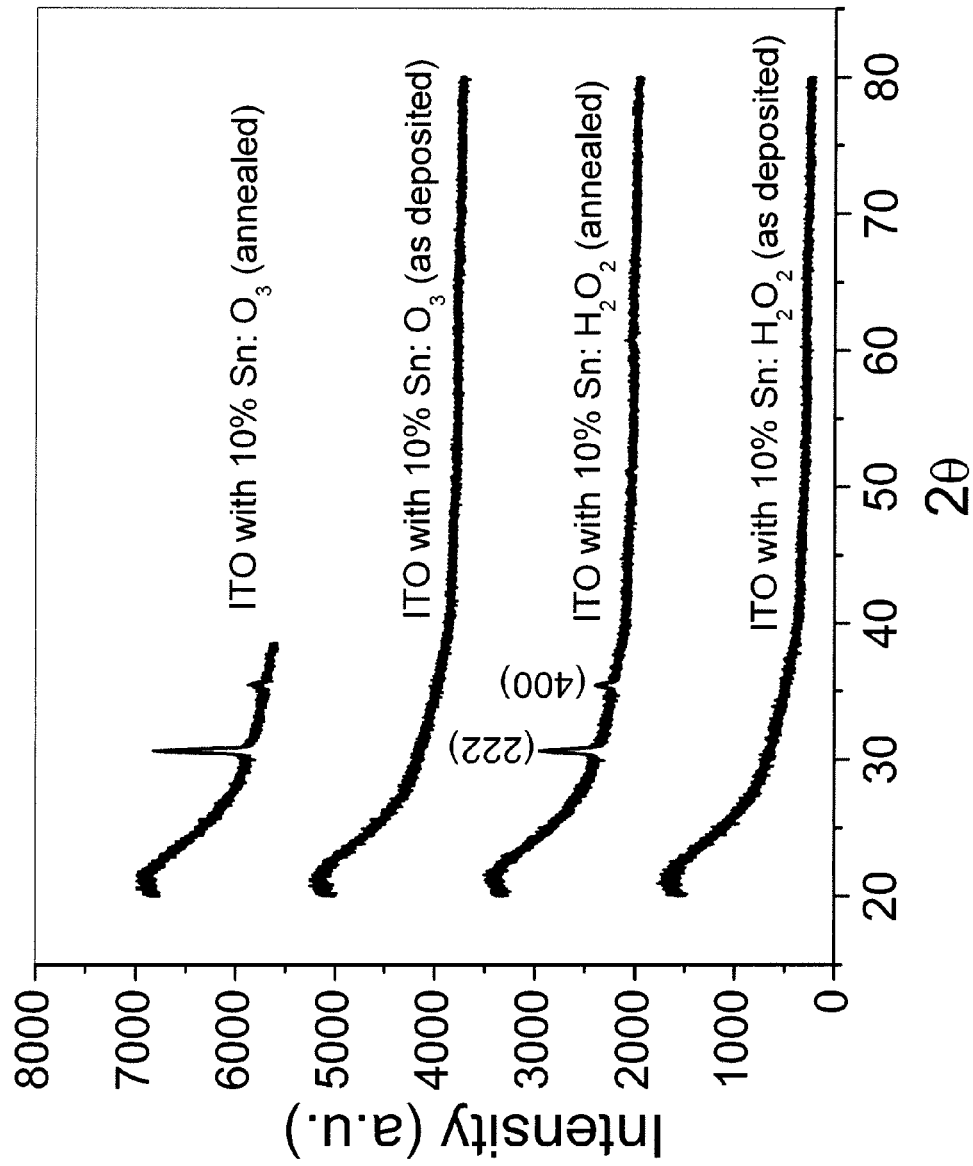
FIG. 24A shows X-ray diffraction patterns for ITO (10% Sn-90% $In_2O_3$) for different oxidizing environments and as deposited as well as annealed.
Figures 24B, 24C:
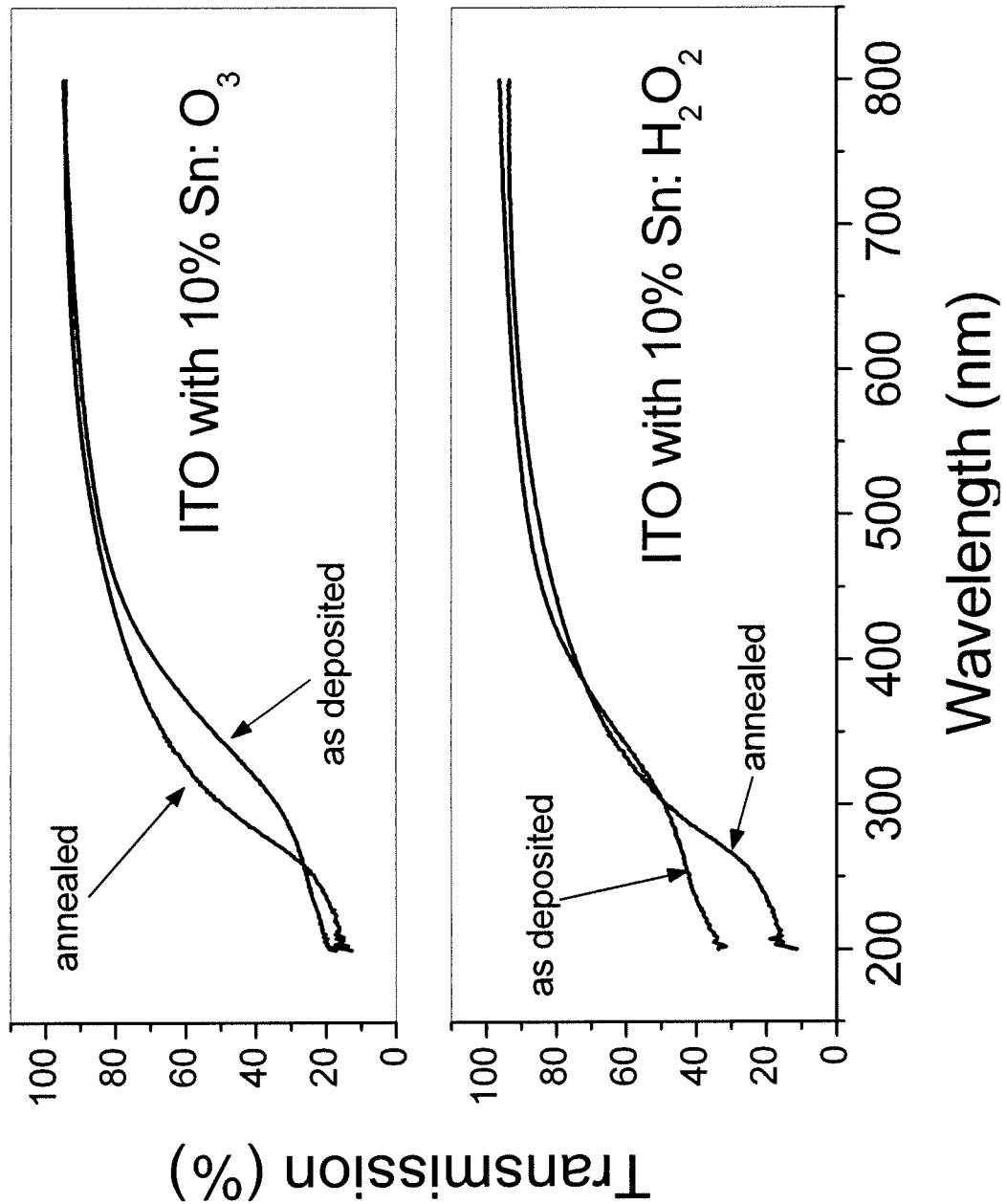
FIG. 24B shows percent transmittance for as deposited and annealed $Sn_2O_3$ deposited with $Sn:O_3$.
FIG. 24C shows percent transmittance for as deposited and annealed $Sn_2O_3$ deposited with $Sn:H_2O_2$.
Figures 24D, 24E, 24F:
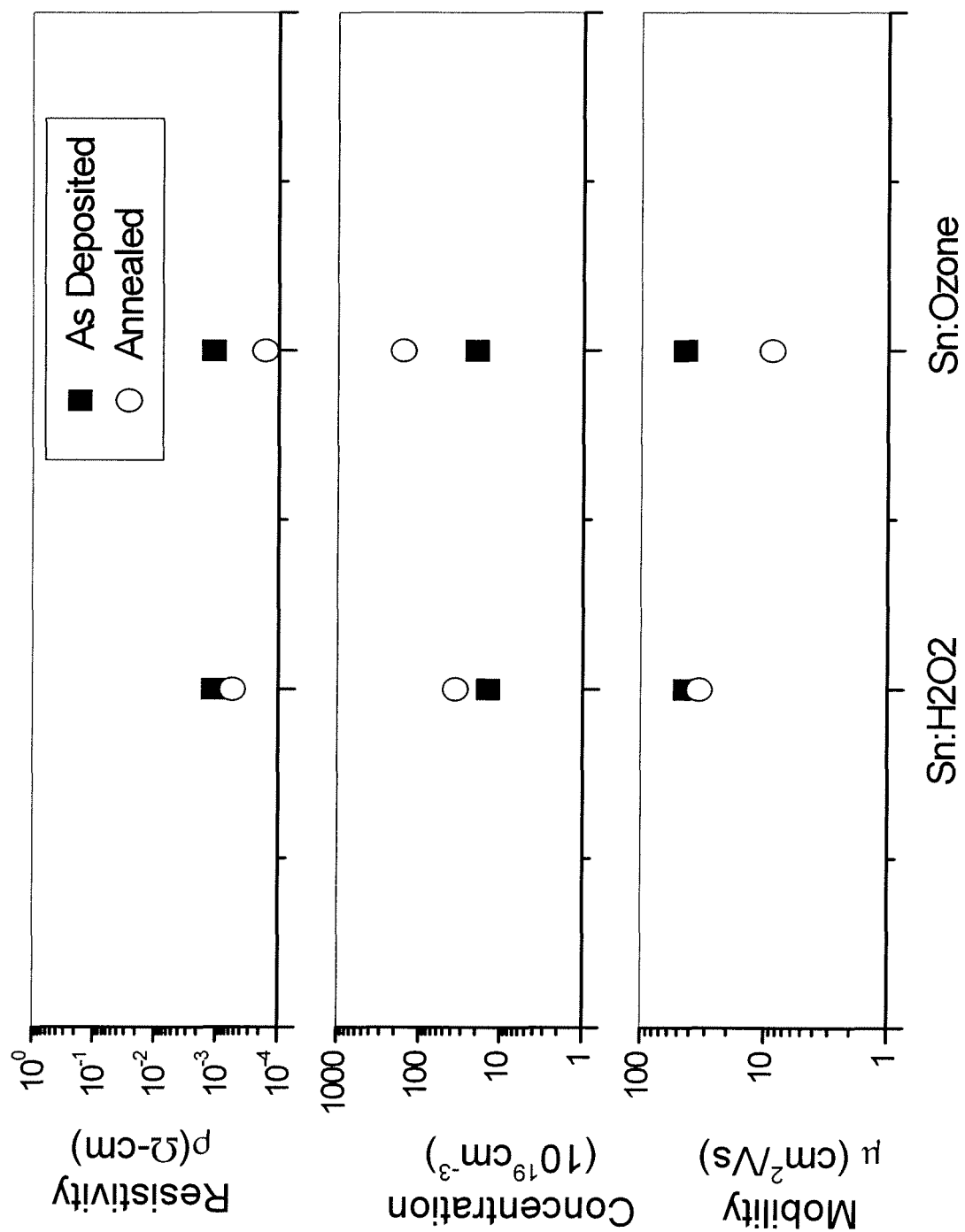
FIG. 24D shows electrical resistivity for $Sn:H_2O_2$ and $Sn:O_3$.
FIG. 24E shows carrier concentration for $SN:H_2O_2$ and $Sn:O_3$.
FIG. 24F shows Hall mobility for $Sn:H_2O_2$ and $Sn:O_3$.
Figures 25C, 25D:
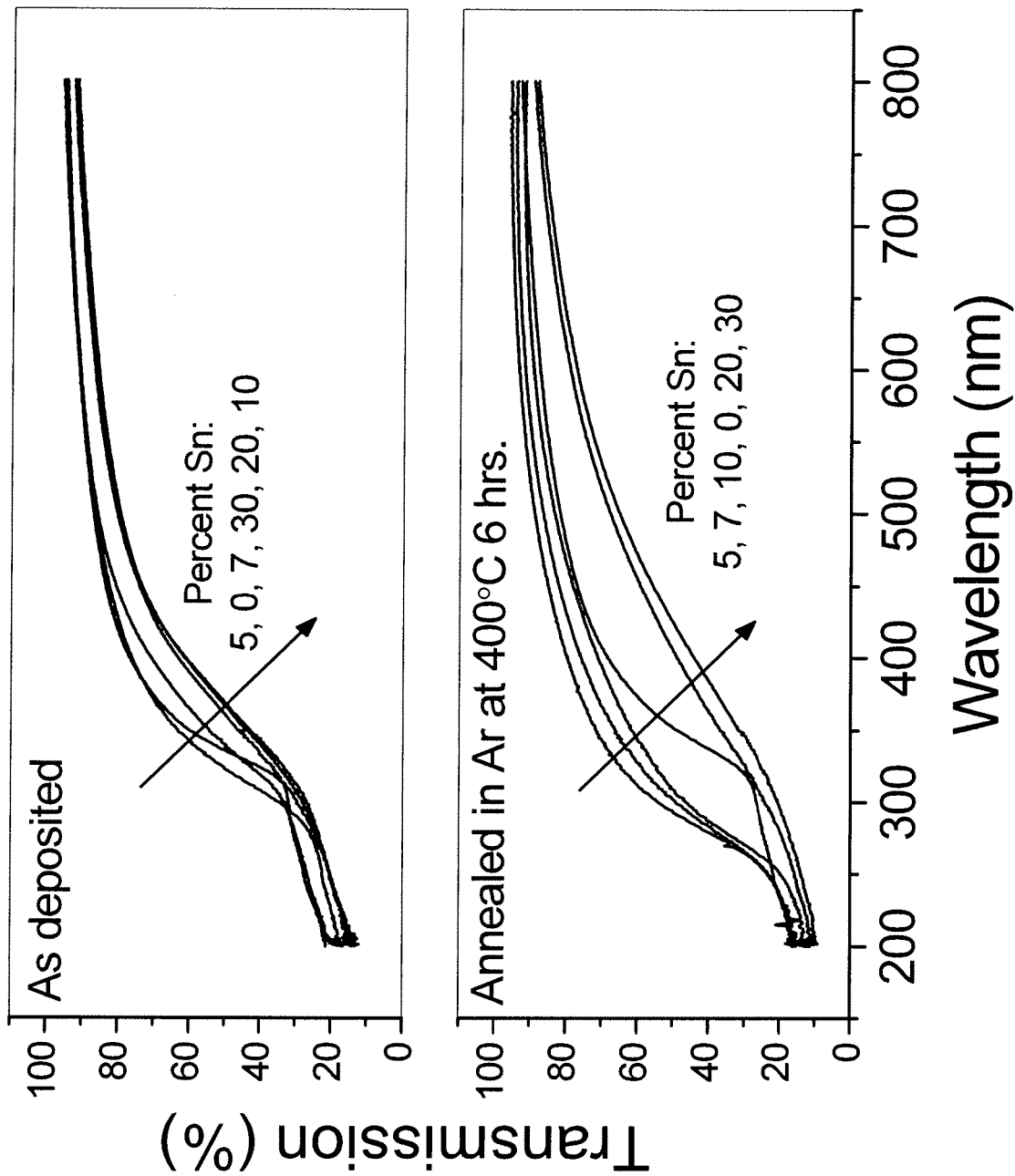
FIG. 25C shows percent transmittance for various % Sn deposited ITO.
FIG. 25D shows the layers of FIG. 25C after various annealing treatments.
Figures 25E, 25F, 25G:
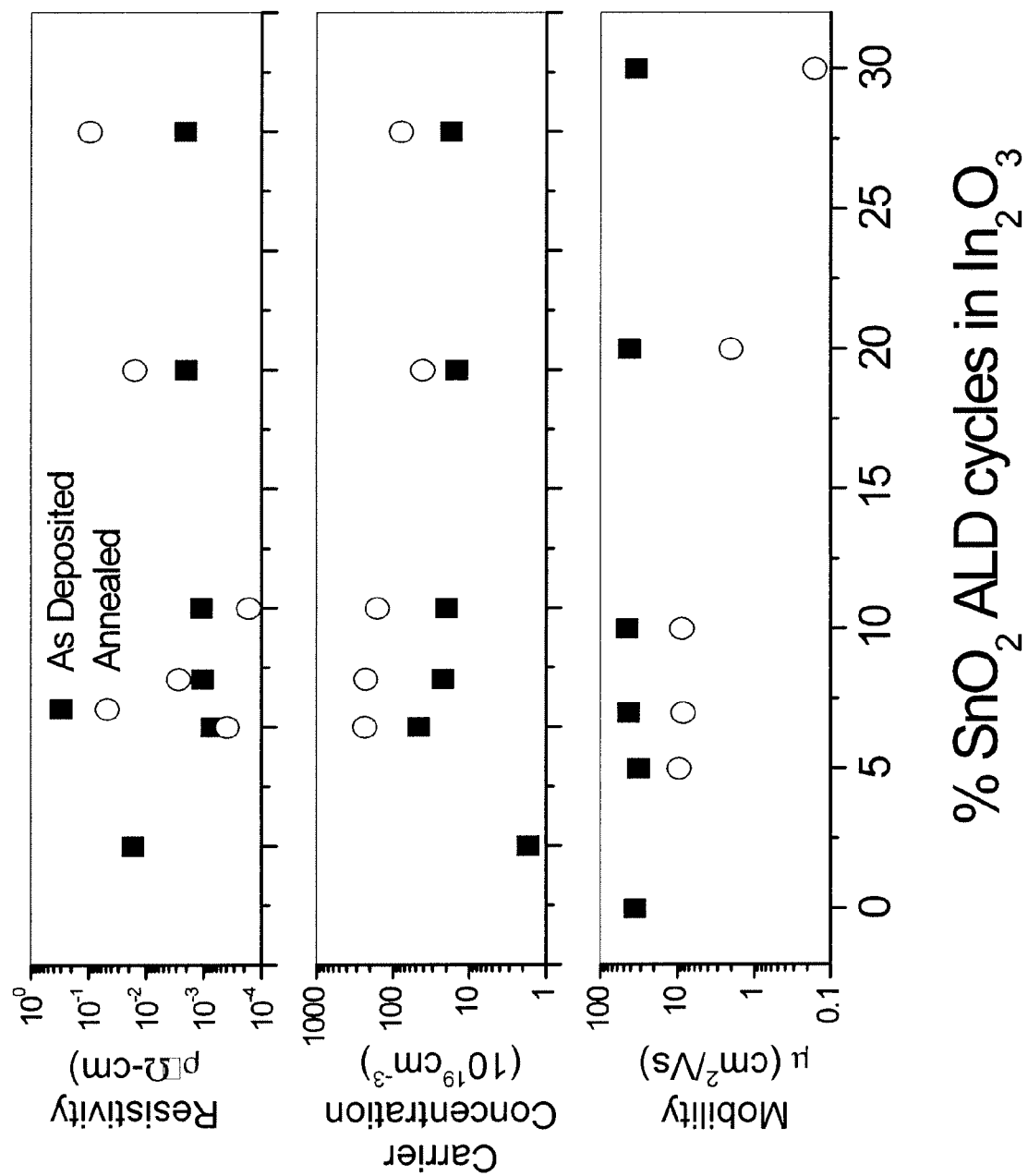
FIG. 25E shows resistivity for various % SnO ALD cycles in $In_2O_3$.
FIG. 25F shows carrier concentration for the various % SnO ALD cycles.
FIG. 25G shows Hall mobility for the various of % SnO ALD cycles.
Figure 26:
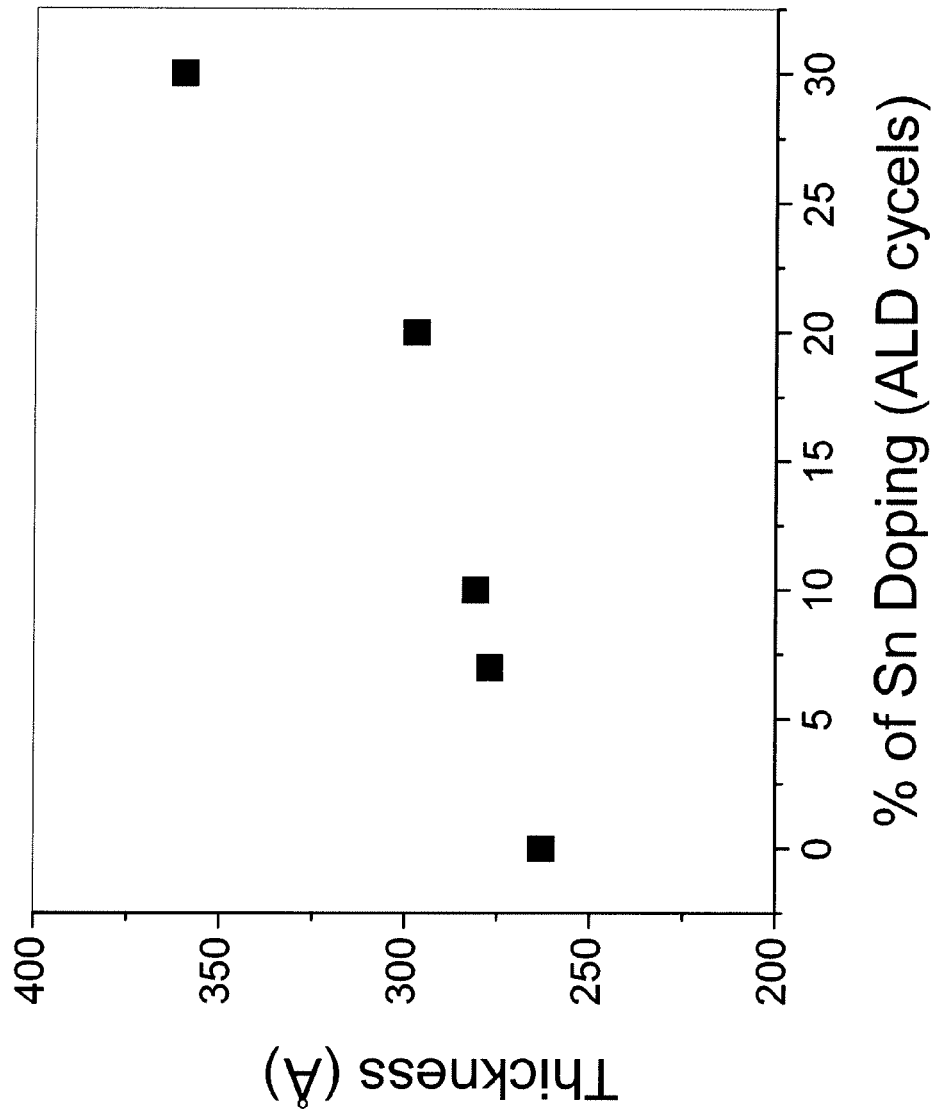
FIG. 26 shows layer thickness versus % doping in $In_2O_3$.
Figure 27:
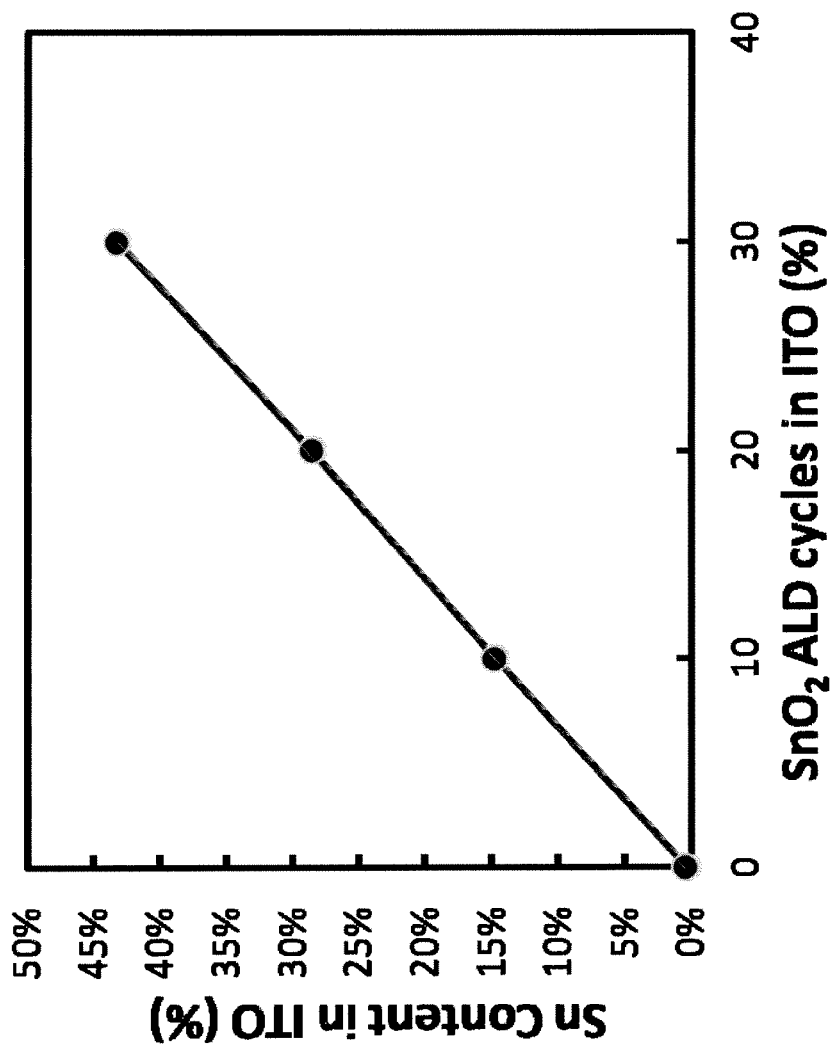
FIG. 27 shows XRF analysis of ITO for various amounts of Sn.
Figure 28:
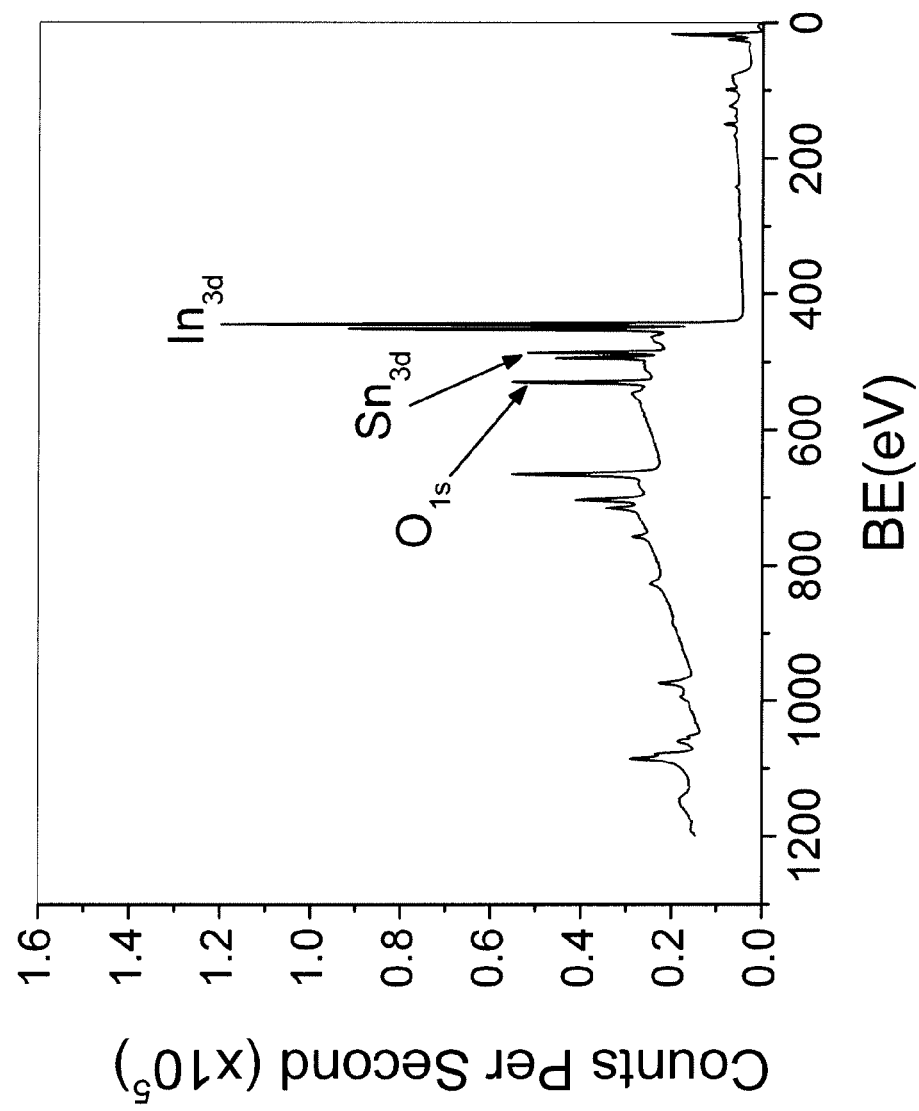
FIG. 28 shows after Ar sputter full scan XPS for as deposited 10% Sn ALD cycles in $In_2O_3$.
Figures 29A, 29B:
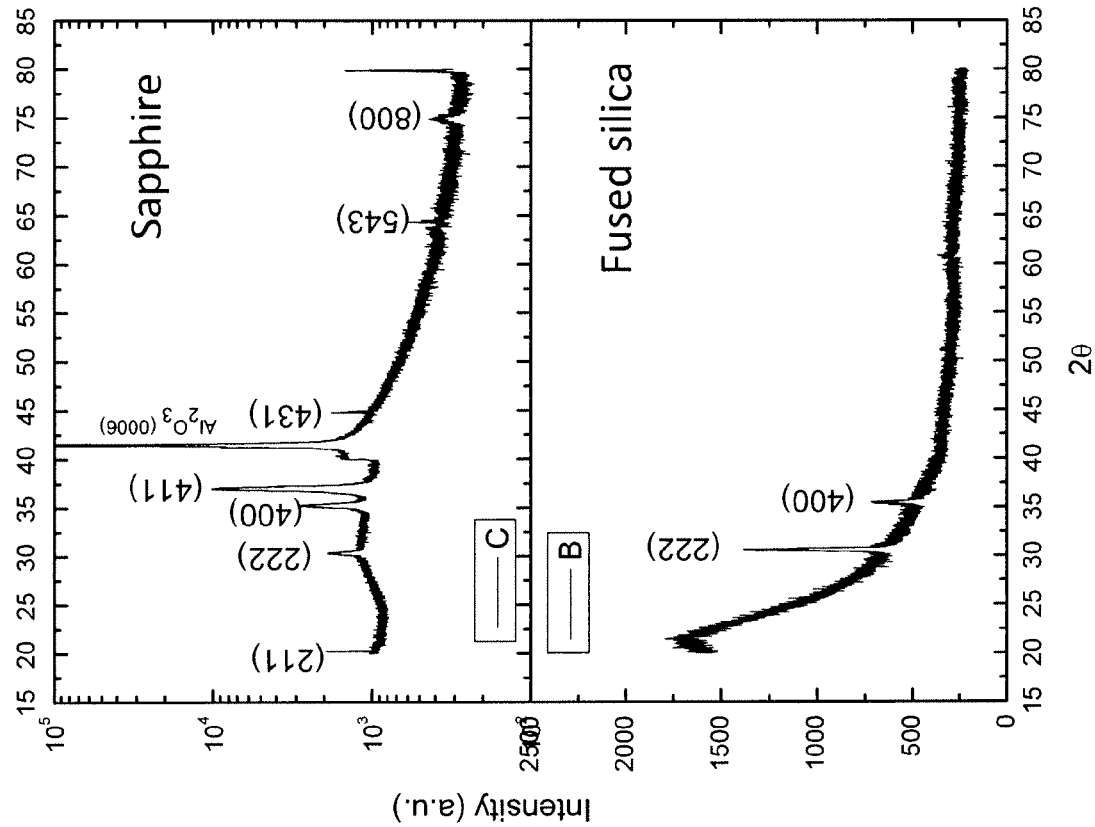
FIG. 29A show an X-ray diffraction pattern of ITO deposited on sapphire.
FIG. 29B shows ITO on fused silica.
Figures 30A, 30B, 30C, 30D, 30E, 30F:
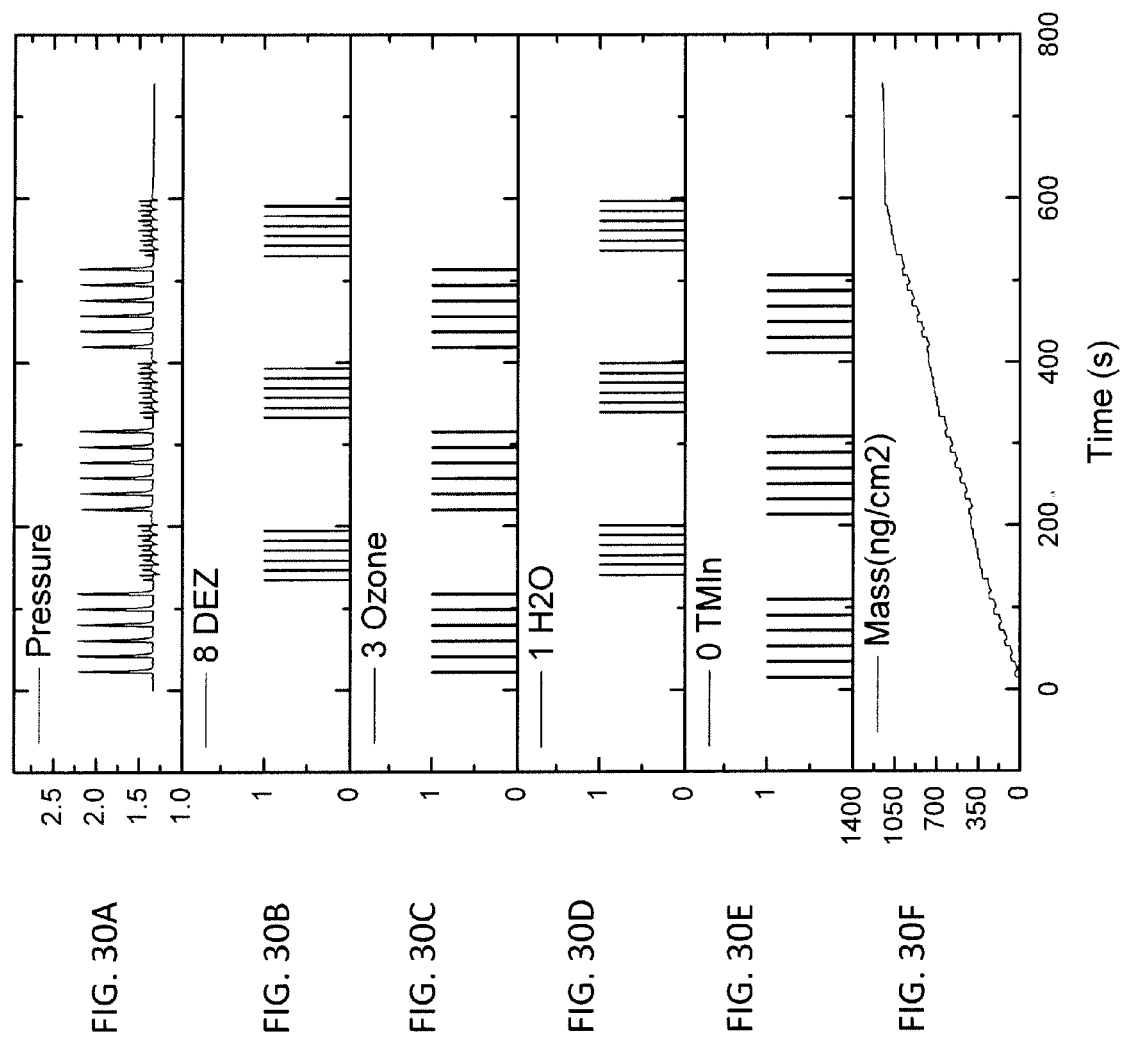
FIGS. 30A-30F show process cycle conditions for deposition of ZnO—$In_2O_3$ layers using $H_2O$ and $O_3$ with TMIn.
Figures 31A, 31B, 31C, 31D, 31E:
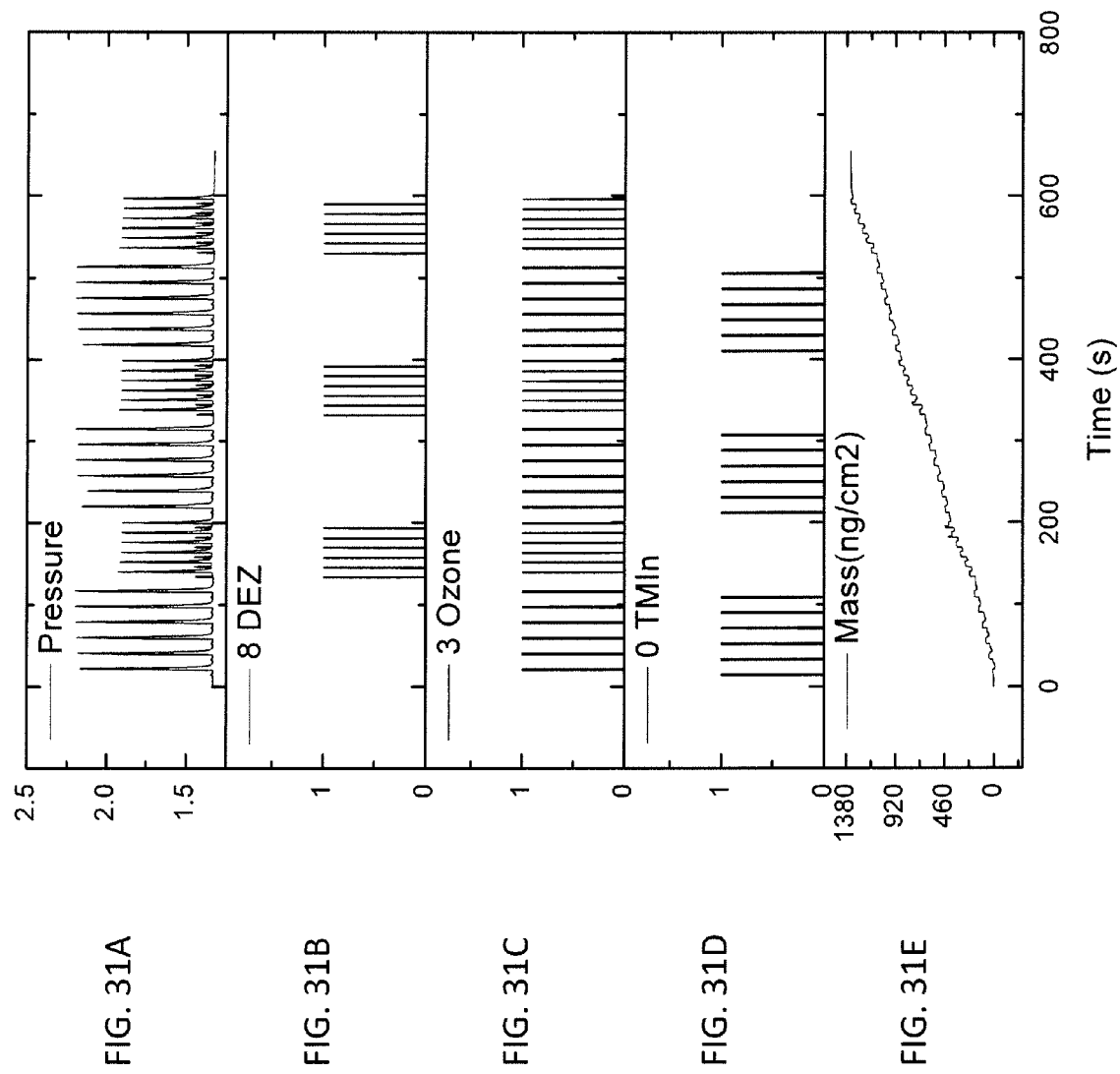
FIGS. 31A-31E show process cycle conditions for deposition of ZnO—$In_2O_3$ layers using $O_3$.
Figures 32A, 32B:
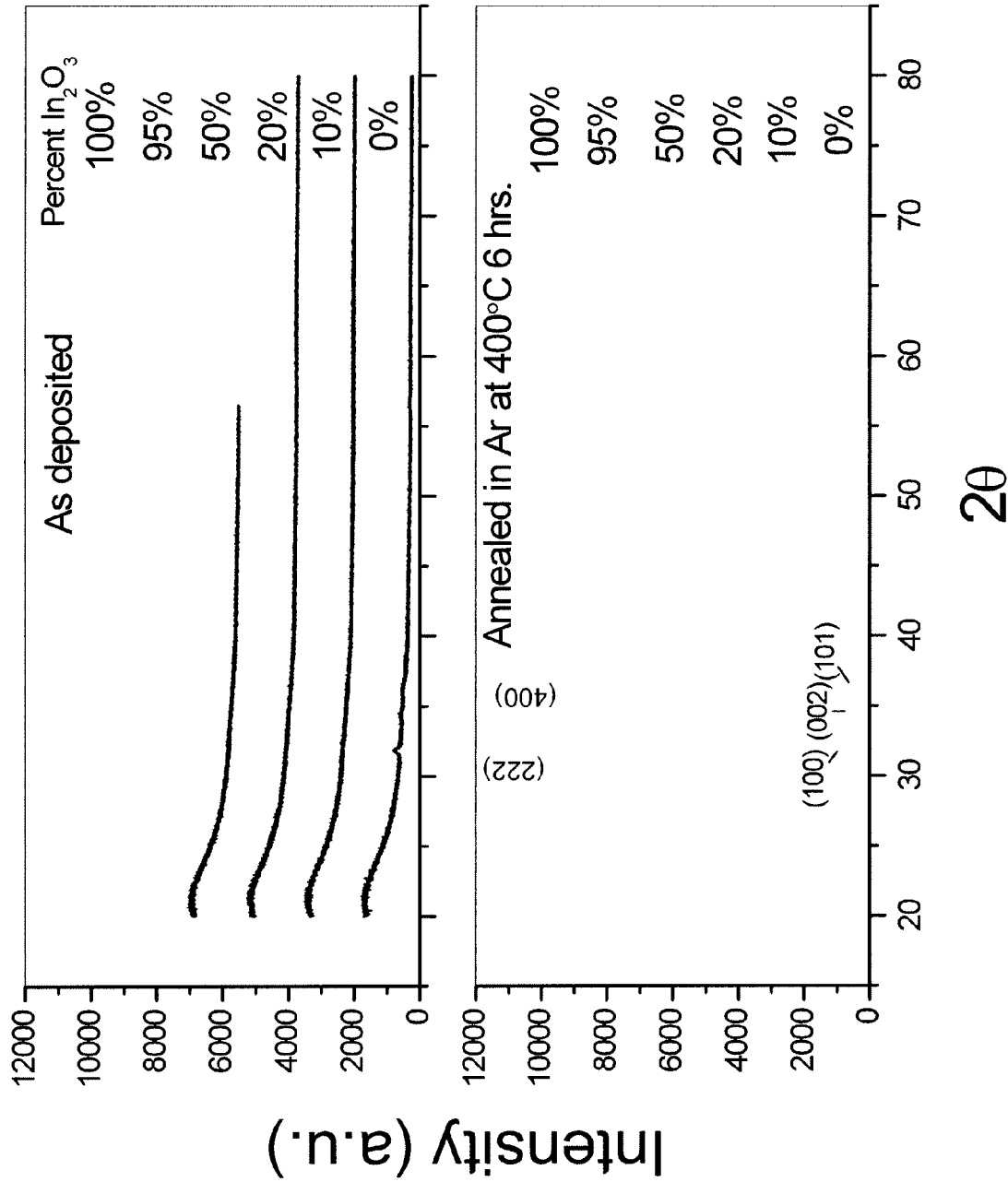
FIG. 32A shows the X-ray diffraction patterns for as deposited ZnO—$In_2O_3$ layers for various percentages of $In_2O_3$.
FIG. 32B shows X-ray diffraction patterns for after annealed ZnO—$In_2O_3$ layers for various percentages of $In_2O_3$.

In a preferred embodiment, $In_2O_3$ was deposited using the system 60 by use of the precursors TMIn and $O_3$, and was compared to unproductive uses of $H_2O$, $H_2O_2$ and $O_2$. This point is further amplified by reference to FIGS. 4A through 8B showing $In_2O_3$ growth rates under various conditions. The resulting $In_2O_3$ layers have highly desirable optical, electrical and mechanical/structural properties; and various properties are shown in FIGS. 9A through 18B, including for example, refractive index, optical transmittance, resistivity (with and without annealing step), carrier concentration, Hall mobility and X-ray diffraction patterns are illustrative of crystalline/amorphous structures (with and without annealing). FIG. 18 shows the various molecular orbital levels of the deposited $In_2O_3$ layers from an XPS scan.

In order to illustrate further the effectiveness of the use of $O_3$ to produce $Sn_2O_3$ deposition along with $In_2O_3$, FIGS. 19 through 29B illustrate growth curves for a variety of conditions, including co-deposition of $In_2O_3$, and data indicating achievement of $Sn_2O_3$ containing layers with desirable optical and electrical properties.

Figure 33:
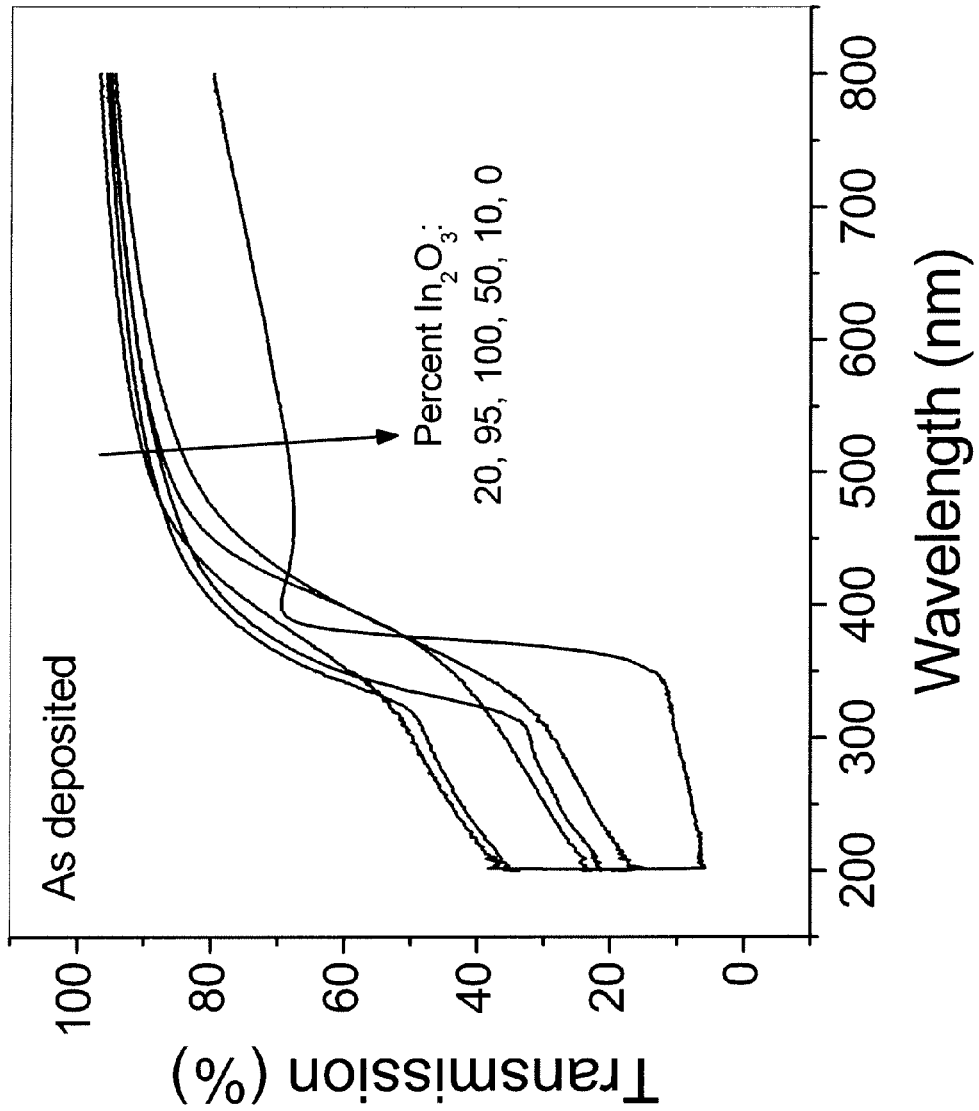
FIG. 33 shows optical transmittance for the as deposited layers of FIG. 32A.
Figures 34A, 34B, 34C:
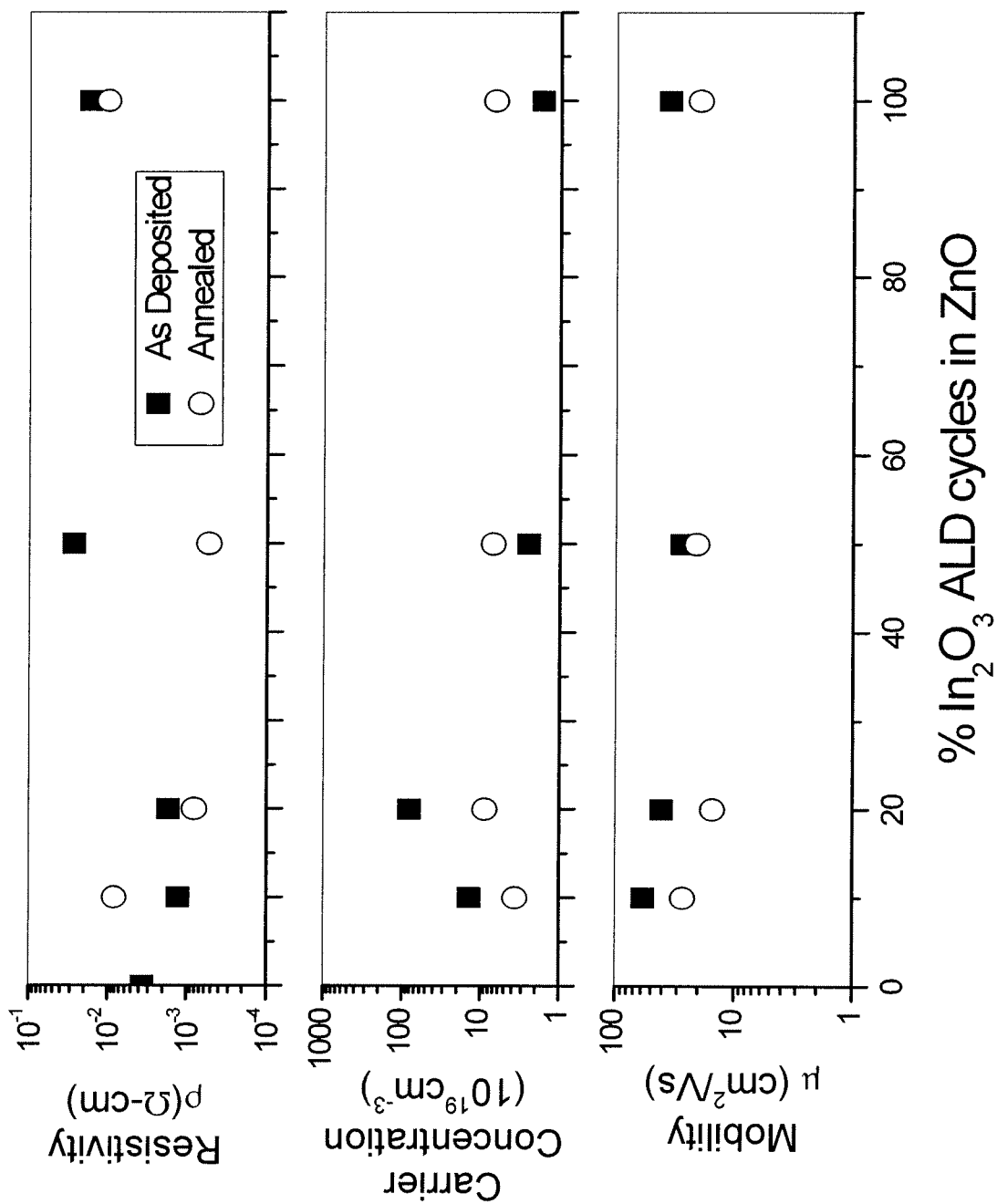
FIG. 34A shows electrical resistivity for the various layers of FIG. 33.
FIG. 34B shows carrier concentration for the various layers of FIG. 33.
FIG. 34C shows Hall mobility for the various layers of FIG. 33.

Other transparent conducting oxides can be deposited very effectively using $O_3$, such as Zn—$In_2O_3$, using the system 60 with precursors ZnO and TMIn to produce doped $In_2O_3$ layers. In FIGS. 30A through 32B are shown growth curves, again showing the effectiveness of the use of $O_3$ with precursors, to provide layers of $In_2O_3$ doped with ZnO. The resulting layers have excellent optical and electrical properties as shown by FIGS. 33 through 34C.

The preferred embodiments described hereinafter illustrate the advantageous features of forming transparent conducting oxides, such as $In_2O_3$ (doped and undoped) by use of TMIn and $TDMAS_n$ tetrakis-(dimethylamino) tin and $O_3$ to produce layers with excellent optical, electrical and structural properties, contrary to conventional teachings. These layers enable application to a wide variety of commercial applications and produceable with greatly reduced cost and simplified system requirements.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A method of forming a transparent conducting oxide layer having a desired set of properties, comprising the steps of:
   providing an atomic layer deposition system;
   providing a substrate disposed in the atomic layer deposition system;
   inputting a precursor consisting essentially of trimethyl indium to the atomic layer deposition system;
   inputting ozone to the atomic layer deposition system;
   depositing $In_2O_3$;
   depositing a dopant using a precursor selected from the group consisting of tetrakis-(dimethylamino) tin and diethyl zinc; and
   forming a deposited layer on the substrate comprising $In_2O_3$ and the dopant, wherein the deposited layer has the desired set of properties;
   where temperature is controlled during deposition in a temperature range between 100° C. to 150° C. and the deposited layer is formed at a growth rate greater than 0.4 Å/cycle.

2. The method as defined in claim 1 wherein the precursor and the ozone are input in a pulsed manner.

3. The method as defined in claim 2 further including pulses of a gas in a purging step.

4. The method as defined in claim 1 wherein the dopant is selected from the group of SnO and ZnO.

5. The method as defined in claim 4 wherein depositing the dopant comprises inputting tetrakis-(dimethylamino) tin and inputting ozone to the atomic layer deposition system for depositing the dopant.

6. The method as defined in claim 1 wherein the deposited layer has a structure selected from the group of amorphous, crystalline and mixtures thereof.

\* \* \* \* \*